United States Patent
Damaraju et al.

(10) Patent No.: US 12,041,714 B2
(45) Date of Patent: Jul. 16, 2024

(54) HEAT DISSIPATION FEATURES OF AUTONOMOUS VEHICLE SENSOR

(71) Applicant: GM Cruise Holdings LLC, San Francisco, CA (US)

(72) Inventors: Srinivasa Rao Damaraju, San Francisco, CA (US); Zoran Stefanoski, San Francisco, CA (US); Reza Azizian, San Jose, CA (US); Robert Cao, San Francisco, CA (US); Kaida Chen, San Jose, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 521 days.

(21) Appl. No.: 17/179,376

(22) Filed: Feb. 18, 2021

(65) Prior Publication Data
US 2022/0264741 A1    Aug. 18, 2022

(51) Int. Cl.
*H05K 1/02* (2006.01)
*G01D 11/24* (2006.01)
*H05K 7/20* (2006.01)
*G01S 13/931* (2020.01)
*G01S 17/931* (2020.01)

(52) U.S. Cl.
CPC ......... *H05K 1/0272* (2013.01); *G01D 11/245* (2013.01); *H05K 7/20254* (2013.01); *H05K 7/20272* (2013.01); *H05K 7/20509* (2013.01); *G01S 13/931* (2013.01); *G01S 17/931* (2020.01)

(58) Field of Classification Search
CPC .................................................. H05K 1/0272
USPC ......................................................... 73/431
See application file for complete search history.

(56) References Cited

U.S. PATENT DOCUMENTS

| 6,286,591 | B1 * | 9/2001 | Bonneville | ........ | H05K 7/20445 165/185 |
| 2009/0121326 | A1 * | 5/2009 | Kim | ........ | H05K 1/141 257/E23.169 |

(Continued)

FOREIGN PATENT DOCUMENTS

CN    111221398 A  *  6/2020

OTHER PUBLICATIONS

Shi et al. Machine translation of CN-111221398-A. Published Jun. 2020. Accessed Jun. 2023. (Year: 2020).*

*Primary Examiner* — Walter L Lindsay, Jr.
*Assistant Examiner* — Philip T Fadul
(74) *Attorney, Agent, or Firm* — Calfee, Halter & Griswold LLP; Todd Behrens; Michael DiCato

(57) ABSTRACT

Various technologies described herein pertain to a sensor for an autonomous vehicle that includes one or more heat dissipation features. A sensor includes a top cover and a bottom cover, where the top cover and the bottom cover form at least a portion of a casing of the sensor. The sensor includes a coldplate, a first printed circuit board, and a second printed circuit board. A top side of the first printed circuit board is coupled to the top cover and a bottom side of the first printed circuit board is coupled to a top side of the coldplate. A top side of the second printed circuit board is coupled to a bottom side of the coldplate and a bottom side of the second printed circuit board is coupled to the bottom cover. Various features described herein enhance heat transfer from components on the first and second printed circuit boards.

20 Claims, 15 Drawing Sheets

(56) References Cited

U.S. PATENT DOCUMENTS

| | | | |
|---|---|---|---|
| 2014/0268553 A1* | 9/2014 | Van Pelt | H01L 23/467 361/679.52 |
| 2015/0289414 A1* | 10/2015 | Berard | H01L 21/50 29/890.032 |
| 2019/0385929 A1* | 12/2019 | Ku | H01L 25/0655 |
| 2021/0096004 A1* | 4/2021 | Baker | G01D 11/245 |

* cited by examiner

HEAT DISSIPATION FEATURES OF AUTONOMOUS VEHICLE SENSOR

BACKGROUND

An autonomous vehicle is a motorized vehicle that can operate without human conduction. An exemplary autonomous vehicle includes a plurality of sensor systems, such as but not limited to, a lidar sensor system, a camera sensor system, and a radar sensor system, amongst others. The autonomous vehicle operates based upon sensor signals output by the sensor systems.

Heat is generated by components included in sensors of the sensor systems of an autonomous vehicle. Moreover, locations of sensors within an autonomous vehicle can lead to the sensors being exposed to additional heat (e.g., a sensor located nearby an engine in an autonomous vehicle can be exposed to heat from the engine) or being unable to access cooler fresh air for sufficiently cooling the sensors. Heat dissipation of conventional sensors may result in the sensors being exposed to high levels of heat for prolonged periods of time, which may detrimentally impact performance of the sensors, lead to failure of the sensors, and so forth.

SUMMARY

The following is a brief summary of subject matter that is described in greater detail herein. This summary is not intended to be limiting as to the scope of the claims.

Described herein are various technologies that pertain to a sensor for an autonomous vehicle that includes one or more heat dissipation features. A sensor can include a top cover and a bottom cover, where the top cover and the bottom cover form at least a portion of a casing of the sensor. Moreover, the sensor can include a coldplate, a first printed circuit board, and a second printed circuit board. The coldplate has a top side and a bottom side. Further, the first printed circuit board has a top side and a bottom side, and the second printed circuit board has a top side and a bottom side. Various components of the sensor can be on the first printed circuit board and the second printed circuit board (e.g., on the top and bottom sides of the first printed circuit board and on the top and bottom sides of the second printed circuit board). The top side of the first printed circuit board can be coupled to the top cover and the bottom side of the first printed circuit board can be coupled to the top side of the coldplate. Moreover, the top side of the second printed circuit board can be coupled to the bottom side of the coldplate and the bottom side of the second printed circuit board can be coupled to the bottom cover. Heat can be transferred from the components on the top side of the first printed circuit board to the top cover, from the components on the bottom side of the first printed circuit board to the coldplate, from the components on the top side of the second printed circuit board to the coldplate, and from the components on the bottom side of the second printed circuit board to the bottom cover. Various features described herein can enhance such heat transfer from the components.

It is contemplated that the sensor can be a radar sensor, a lidar sensor, a camera sensor, a hybrid sensor, or the like. Moreover, the sensor can be included in an autonomous vehicle.

According to various embodiments, the top cover can include a first vapor chamber and the bottom cover can include a second vapor chamber. The top cover can be a single structural unit (e.g., having a unibody design) that defines the first vapor chamber. The first vapor chamber can include a first wick structure. Moreover, the first vapor chamber can be filled with an amount of a working fluid. Similarly, the bottom cover can be a single structural unit that defines the second vapor chamber. The second vapor chamber can include a second wick structure. The second vapor chamber can also be filled with an amount of the working fluid.

In accordance with various embodiments, the coldplate can be referenced to a top of a particular component on the bottom of the first printed circuit board (as opposed to be referenced to the first printed circuit board). The particular component can be a relatively high power component or a relatively high power density component. By being referenced to the top of the particular component, a thickness of a thermal interface material layer between the particular component and the coldplate can be reduced (as compared to a design where the coldplate is referenced to the first printed circuit board). The coldplate can similarly be referenced to a top of another particular component on the top of the second printed circuit board (as opposed to be referenced to the second printed circuit board).

Pursuant to various embodiments, the sensor can include one or more heat spreaders. A heat spreader can be between a component on the bottom side of the first printed circuit board and the top side of the coldplate. Additionally or alternatively, a heat spreader can be between a component on the top side of the second printed circuit board and the bottom side of the coldplate. The heat spreader(s) can be formed of pyrolytic graphite in various embodiments.

In various embodiments, the sensor can include a flexible vapor line, a flexible liquid line, and a remote heat sink. The remote heat sink can be positioned at a distance from the top cover, the bottom cover, the coldplate, the first printed circuit board, and the second printed circuit board. The flexible vapor line has a first end and a second end. Moreover, the flexible vapor line can be a flexible tube that lacks an internal structure. The flexible liquid line has a first end and a second end. The flexible liquid line can be a flexible tube that includes an internal structure (e.g., to facilitate transferring liquid from the first end to the second end of the flexible liquid line). The first end of the flexible vapor line can be coupled to the coldplate and the second end of the flexible vapor line can be coupled to the remote heat sink. Further, the first end of the flexible liquid line can be coupled to the remote heat sink and the second end of the flexible liquid line can be coupled to the coldplate.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
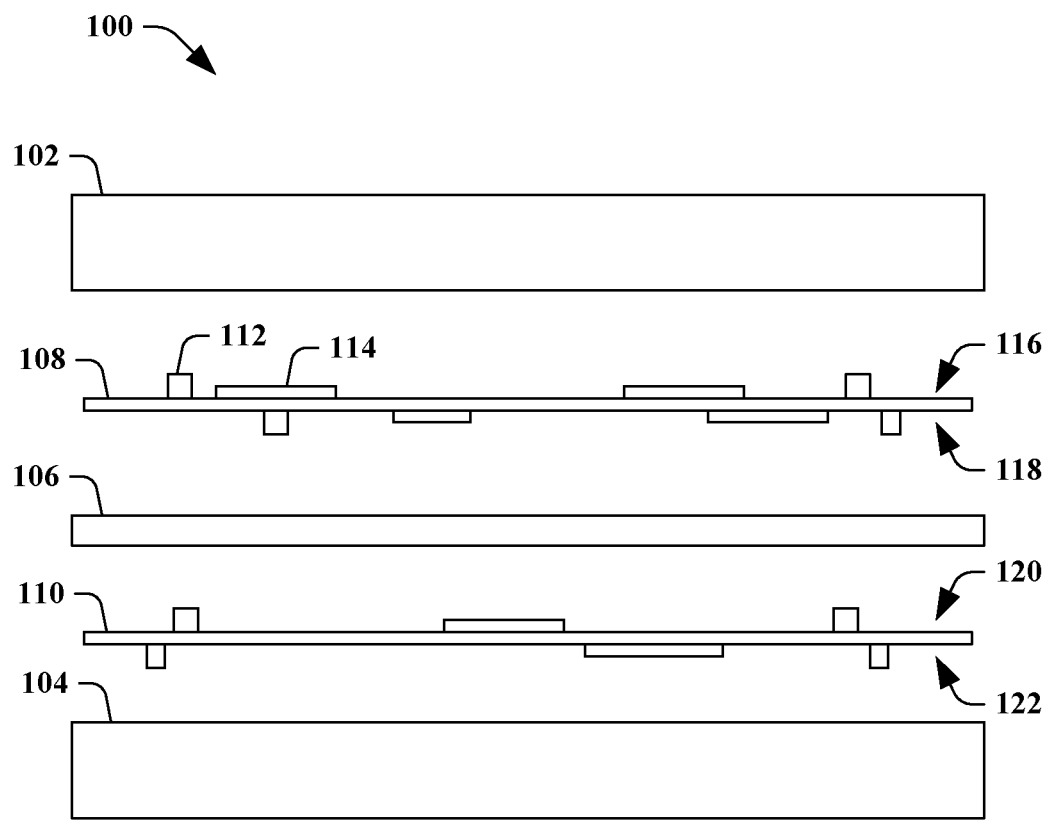
FIG. 1 illustrates a side view of an exemplary sensor for an autonomous vehicle.

Various technologies pertaining to heat dissipation features of a sensor of an autonomous vehicle are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Further, as used herein, the term "exemplary" is intended to mean "serving as an illustration or example of something."

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

The terms "top side" and "bottom side" are used herein for identification purposes. It is contemplated that a sensor can be oriented in an autonomous vehicle in substantially any manner (e.g., a top side need not be above a bottom side when a sensor is in an autonomous vehicle).

Referring now to the drawings, FIG. 1 illustrates a side view of an exemplary sensor 100 for an autonomous vehicle. The sensor 100 can be a radar sensor, a lidar sensor, a camera sensor, a hybrid sensor, or the like. A hybrid sensor, for instance, can combine sensing modalities (e.g., a hybrid sensor can be a combination of two or more of a lidar sensor, a camera sensor, and a radar sensor). The sensor 100 can be configured for use in an autonomous vehicle; thus, the sensor 100 can be attachable to an autonomous vehicle. The sensor 100 can include various heat dissipation features to enhance heat transfer from heat generation source(s) included in the sensor 100 as compared to conventional sensors.

The sensor 100 includes a top cover 102 and a bottom cover 104. Moreover, the sensor 100 includes a coldplate 106. The sensor 100 also includes a first printed circuit board 108 and a second printed circuit board 110. The first printed circuit board 108 and the second printed circuit board 110 can include various components of the sensor 100. The components can be integrated into, formed on, mounted on, etc. the first printed circuit board 108 and the second printed circuit board 110 (referred to herein as "a component being on a printed circuit board"). For instance, a component 112 and a component 114 can be on the first printed circuit board 108. Moreover, substantially any number of other components in addition to the components 112-114 can be on the first printed circuit board 108. Further, substantially any number of components can be on the second printed circuit board 110.

Components can be on a top side 116 and a bottom side 118 of the first printed circuit board 108. Likewise, components can be on a top side 120 and a bottom side 122 of the second printed circuit board 110. Examples of the components on the first printed circuit board 108 and the second printed circuit board 110 include central processing unit(s) (CPU(s)), graphics processing unit (GPU(s)), switch(es) (ethernet switch(es)), field-programmable gate array(s) (FPGA(s)), amongst others. The components on the first printed circuit board 108 and the second printed circuit board 110 include the types of components for enabling operation of a particular type of sensor (e.g., if the sensor 100 is a camera sensor then the components on the first printed circuit board 108 and the second printed circuit board 110 include the components of the camera sensor). Moreover, sizes of the components on the first printed circuit board 108 and the second printed circuit board 110 can differ (e.g., the component 112 is taller than the component 114).

Figure 2:
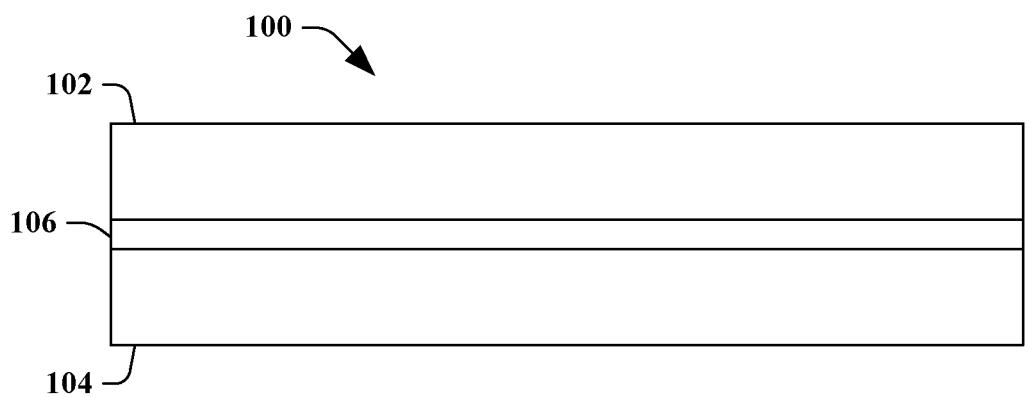
FIG. 2 illustrates a side view of a top cover, a bottom cover, a coldplate, a first printed circuit board, and a second printed circuit board of the sensor of FIG. 1 assembled together.

The top cover 102 and the bottom cover 104 form at least a portion of a casing of the sensor 100 as shown in FIG. 2 (e.g., an enclosure, a housing). As illustrated in FIG. 2, the top cover 102, the bottom cover 104, the coldplate 106, the first printed circuit board 108, and the second printed circuit board 110 of the sensor 100 are assembled together. The first printed circuit board 108 and the second printed circuit board 110 can be coupled to the coldplate 106 (e.g., the first printed circuit board 108 being coupled to a top side of the coldplate 106 and the second printed circuit board 110 being coupled to a bottom side of the coldplate 106). Moreover, the top cover 102 can enclose the first printed circuit board 108 and the bottom cover 104 can enclose the second printed circuit board 110. Thus, the top cover 102 can be coupled to the first printed circuit board 108, and the bottom cover 104 can be coupled to the second printed circuit board 110. According to an example, the top cover 102 can be attached to the top side of the coldplate 106 with the first printed circuit board 108 positioned between and coupled to the top cover 102 and the coldplate 106. Further following this example, the bottom cover 104 can be attached to the bottom side of the coldplate 106 with the second printed circuit board 110 positioned between and coupled to the bottom cover 104 and the coldplate 106.

Pursuant to various examples, the top cover 102, the bottom cover 104, and/or the coldplate 106 can be heat sinks. The components on the first printed circuit board 108 and the second printed circuit board 110 can generate heat during operation of the sensor 100. For instance, heat can flow from the components on the top surface 116 of the first printed circuit board 108 to the top cover 102, and heat can flow from the components on the bottom surface 118 of the first printed circuit board 108 to the coldplate 106. Further, heat can flow from the components on the top surface 120 of the second printed circuit board 110 to the coldplate 106, and heat can flow from the components on the bottom surface 122 of the second printed circuit board 110 to the bottom cover 104.

In accordance with various embodiments, the coldplate 106 can include one or more fluid channels. Pursuant to these embodiments, a working fluid can be within the one or more fluid channels of the coldplate 106. The working fluid, for instance, can be a mixture of water and glycol, a mixture of water and alcohol, acetone, or de-ionized water; yet, other types of working fluids are intended to fall within the scope of the hereto appended claims. The working fluid in the fluid channel(s) of the coldplate 106 can enable transferring heat away from portion(s) of the coldplate 106 adjacent to components on the first printed circuit board 108 and the second printed circuit board 110 that generate heat (or that generate more heat relative to other components). The fluid channel(s) of the coldplate 106, for instance, can be under vacuum.

According to various embodiments, although not shown in FIGS. 1-2, it is contemplated that fins can be formed on exterior surfaces of the top cover 102 and the bottom cover 104. Moreover, although not depicted in FIGS. 1-2, it is to be appreciated that the top cover 102 and the bottom cover 104 can enclose the coldplate 106 (e.g., an exterior edge of the coldplate 106 may be enclosed within the top cover 102 and the bottom cover 104 as opposed to an exterior edge of the coldplate 106 being exposed as shown in FIG. 2).

The sensor 100 can include various features that facilitate transferring heat away from the components on the first printed circuit board 108 and the second printed circuit board 110. Thus, the features can enable dissipating more heat from the components to the surroundings of the sensor 100 as compared to conventional approaches. Features that enhance transferring heat away from the components on the printed circuit boards 108-110 are described in the various embodiments set forth below. It is to be appreciated that the sensor 100 can include one or more of these features. For instance, features described below in differing embodiments may be used in combination in the sensor 100 (e.g., all of the below features can be used in combination, a subset of the below features can be used in combination).

Figure 3:
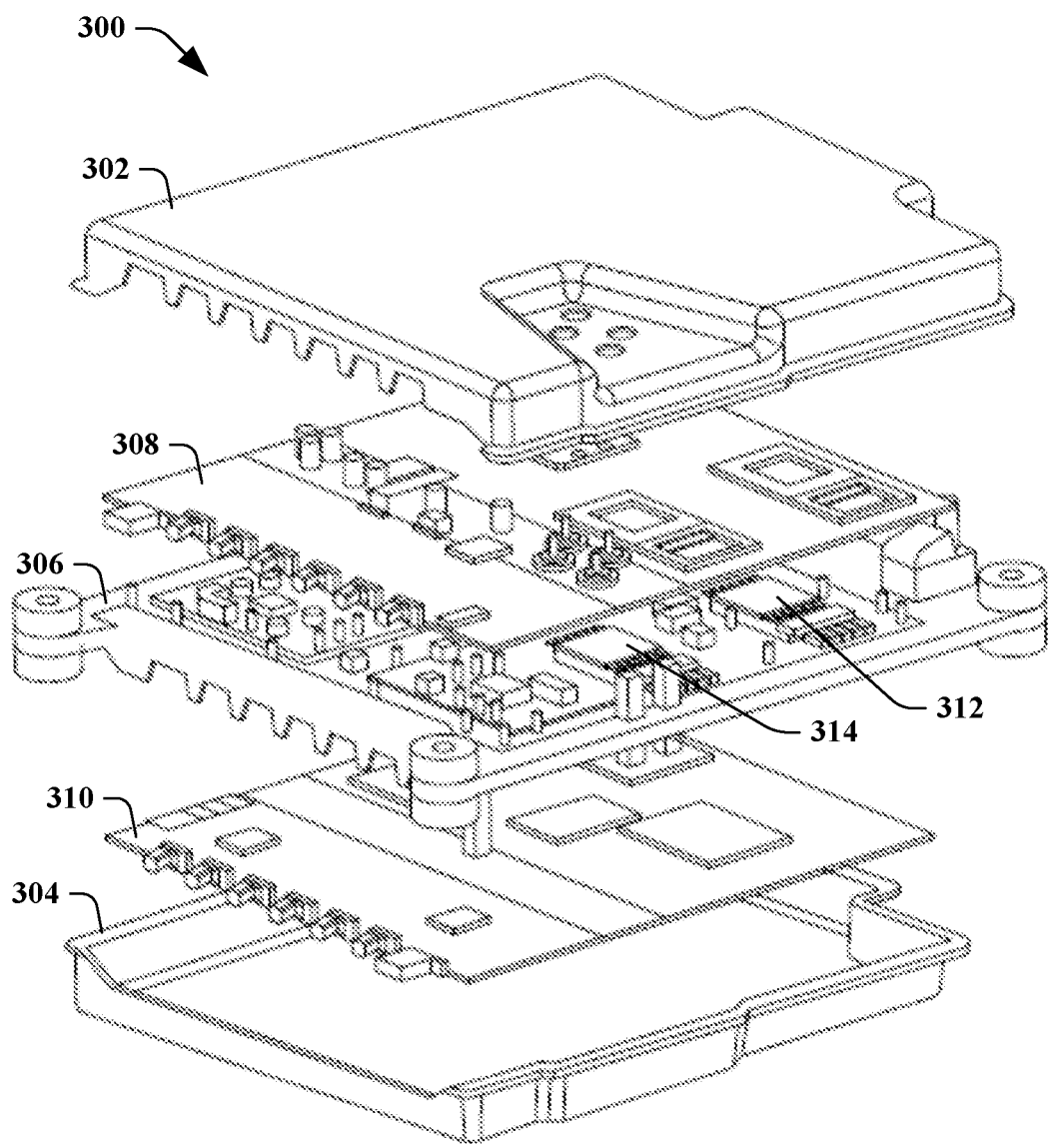
FIGS. 3-4 illustrate various views of an exemplary embodiment of the sensor of FIG. 1.
Figure 4:
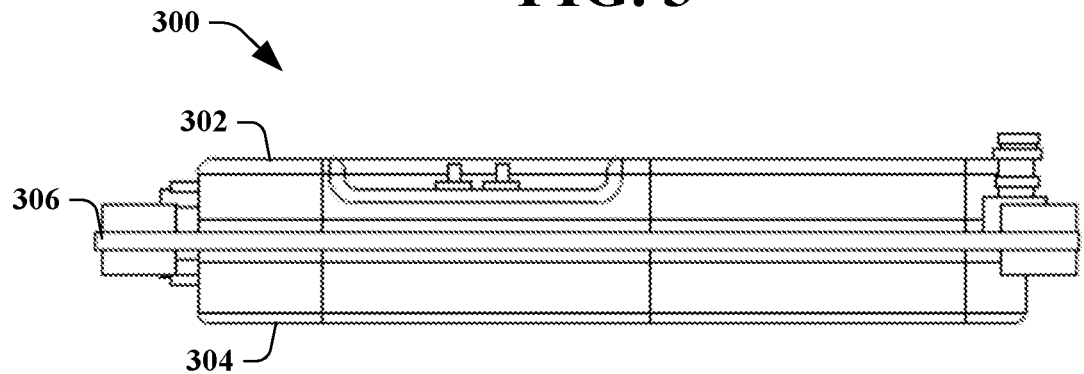

Now turning to FIGS. 3-4, illustrated are various views of an exemplary embodiment of a sensor 300 (e.g., the sensor 100). As depicted in FIG. 3, a perspective view of the exemplary embodiment of the sensor 300 is shown. Similar to above, the sensor 300 includes a top cover 302 (e.g., the top cover 102), a bottom cover 304 (e.g., the bottom cover 104), a coldplate 306 (e.g., the coldplate 106), a first printed circuit board 308 (e.g., the first printed circuit board 108), and a second printed circuit board 310 (e.g., the second printed circuit board 110). Moreover, FIG. 4 illustrates a side view of the exemplary embodiment of the sensor 300 depicted in FIG. 3 being assembled.

According to various examples, the sensor 300 can include one or more heat spreaders. For instance, as illustrated in FIG. 3, a heat spreader 312 and a heat spreader 314 can be between components on the first printed circuit board 308 (e.g., on a bottom surface of the first printed circuit board 308) and the coldplate 306. While not shown, it is to be appreciated that the sensor 300 can include substantially any number of other heat spreaders in addition to and/or instead of the heat spreaders 312-314. For instance, it is contemplated that other heat spreader(s) can additionally or alternatively be between the second printed circuit board 310 and the coldplate 306. Additionally or alternatively, heat spreader(s) can be between the first printed circuit board 308 and the top cover 302 and/or between the second printed circuit board 310 and the bottom cover 304.

A heat spreader (e.g., the heat spreaders 312-314) can provide thermal conduction to facilitate heat flow from a top surface of a component aligned with the heat spreader to a heat sink (e.g., the coldplate 306, the top cover 302, the bottom cover 304). A heat spreader can be aligned with a relatively high power component or a relatively high power density component. Examples of such components include, for example, a central processing unit (CPU), a graphics processing unit (GPU), a switch (ethernet switch), a field-programmable gate array (FPGA), or the like.

Figure 5:
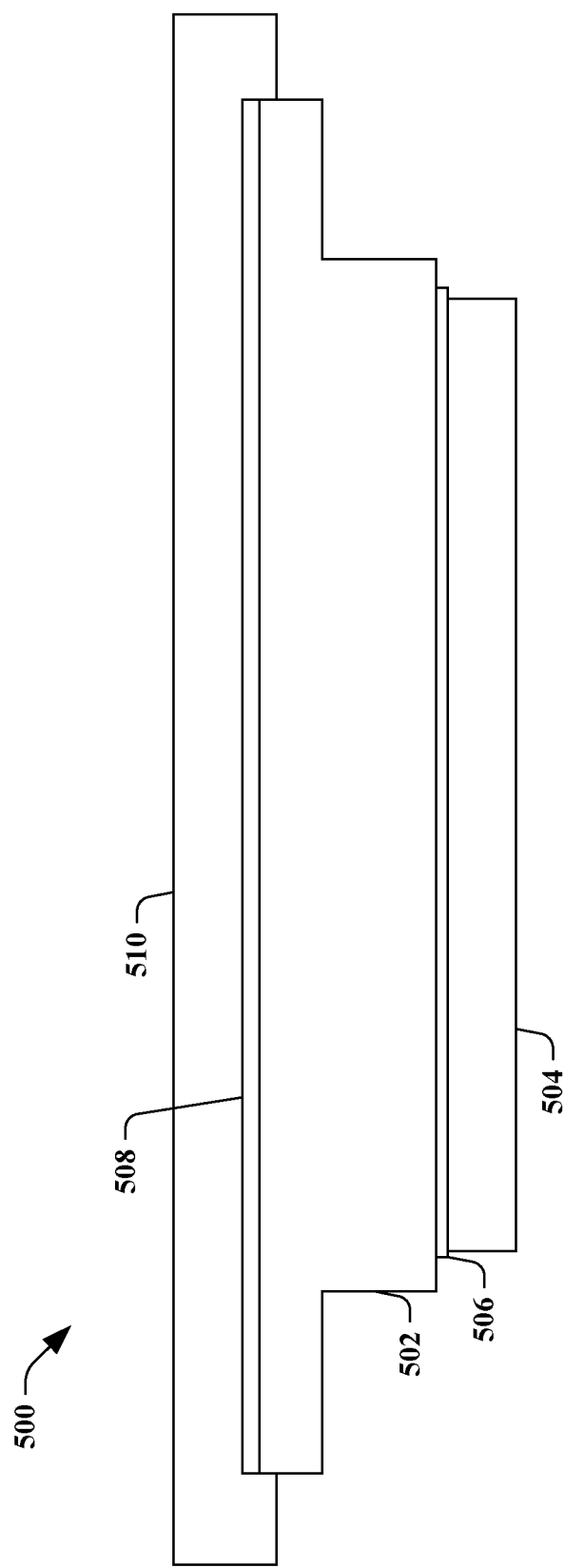
FIG. 5 illustrates a side view of a portion of a sensor that includes an exemplary heat spreader.

With reference to FIG. 5, illustrated is a side view of a portion 500 of a sensor (e.g., a portion of the sensor 100, a portion of the sensor 300) that includes an exemplary heat spreader 502 (e.g., one of the heat spreaders 312-314). As shown in FIG. 5, the portion 500 of the sensor further includes a lid 504 of a component, a first thermal interface material layer 506, a second thermal interface material layer 508, and a heat sink 510. The component can be one of the components on a first printed circuit board (e.g., the first printed circuit board 108, the first printed circuit board 308) or one of the components on a second printed circuit board (e.g., the second printed circuit board 110, the second printed circuit board 310). The heat sink 510, for instance, can be a coldplate (e.g., the coldplate 106, the coldplate 306), a top cover (e.g., the top cover 102, the top cover 302), or a bottom cover (e.g., the bottom cover 104, the bottom cover 304) of the sensor.

The heat spreader 502 is positioned between the lid 504 of the component and the heat sink 510. Moreover, the first thermal interface material layer 506 is between the lid 504 of the component and the heat spreader 502. Further, the second thermal interface material layer 508 is between the heat spreader 502 and the heat sink 510.

The heat spreader 502 can be a pedestal positioned on top of the lid 504 of the component. The heat spreader 502 can be employed due to differences in mechanical clearances of differing components on a printed circuit board. For instance, larger mechanical clearances can exist between a top of a GPU lid as compared to a top of other components on the first printed circuit board. Thus, the heat spreader 502 along with the first thermal interface material layer 506 and the second thermal interface material layer 508 can be positioned between the lid 504 (e.g., the top of the GPU lid) and the heat sink 510 to fill a gap that would otherwise exist there between since other components on the same printed circuit board may be taller, and thus, a similar gap would not exist between the other components and the heat sink 510.

In various embodiments, the heat spreader 502 is formed of pyrolytic graphite. The pyrolytic graphite can provide reduced thermal resistance, reduced weight, and improved overall thermal performance as compared to other types of materials (e.g., as compared to a heat spreader formed of aluminum (Al6063-T5) or a heat spreader formed of copper).

For example, pyrolytic graphite can provide thermal conductivity greater than 1500 W/m·K (watts per meter-kelvin) in two directions and about 7 W/m·K in the other direction. According to an illustration, the maximum thermal conductivity of pyrolytic graphite can be 1700 W/m·K. In comparison, aluminum can have a maximum thermal conductivity of about 200 W/m·K (e.g., about 209 W/m·K) and copper can have a maximum thermal conductivity of about 385 W/m·K. Thus, by having the heat spreader 502 formed of pyrolytic graphite, more heat can be transferred from the lid 504 of the component to the heat sink 510 (e.g., in the vertical direction) as compared to a heat spreader being formed of aluminum or copper.

Moreover, compared to the other types of materials, pyrolytic graphite can provide thermal performance improvement. For instance, compared to a heat spreader formed of aluminum as a baseline, the heat spreader 502 being formed of pyrolytic graphite can provide thermal performance improvement for a GPU (Tj Delta) of 3.6 C. As a further point of comparison, a heat spreader formed of copper can provide thermal performance improvement for a GPU of 1.9 C relative to a baseline of a heat spreader formed of aluminum (e.g., the pyrolytic graphite heat spreader can provide a 1.7 C thermal performance improvement for a GPU as compared to a copper heat spreader).

Additionally, pyrolytic graphite is less dense than aluminum and copper. For instance, a density of pyrolytic graphite can be 2250 kg/m3, whereas a density of aluminum can be 2700 kg/m3 and a density of copper can be 8933 kg/m3. Thus, if the heat spreader 502 is formed of pyrolytic graphite, then the mass of the heat spreader 502 can be 22.6 grams. In comparison, a heat spreader formed of aluminum can be 27.2 grams and a heat spreader formed of copper can be 89.8 grams. Accordingly, compared to a heat spreader formed of aluminum, a copper heat spreader can weigh significantly more (62.7 grams). Further, the heat spreader 502 formed of pyrolytic graphite can weigh 4.5 grams less than the heat spreader formed of aluminum. According to various embodiments, a sensor (e.g., the sensor 100, the sensor 300) can include four GPUs. Thus, four heat spreaders (e.g., each substantially similar to the heat spreader 502) can be included as part of the sensor. In such embodiments, the four heat spreaders formed of pyrolytic graphite can weigh about 18 grams less than four heat spreaders formed of aluminum. Moreover, the four heat spreaders formed of pyrolytic graphite can weight about 268.8 grams less than four heat spreaders formed of copper. It is to be appreciated, however, that other heat spreader weights are intended to fall within the scope of the hereto appended claims, as such weights can depend on the size, shape, and dimensions of the heat spreaders; however, regardless of the size, shape, and dimensions of the heat spreaders, use of pyrolytic graphite can result in a reduced weight relative to use of aluminum or copper for a heat spreader.

Figure 6:
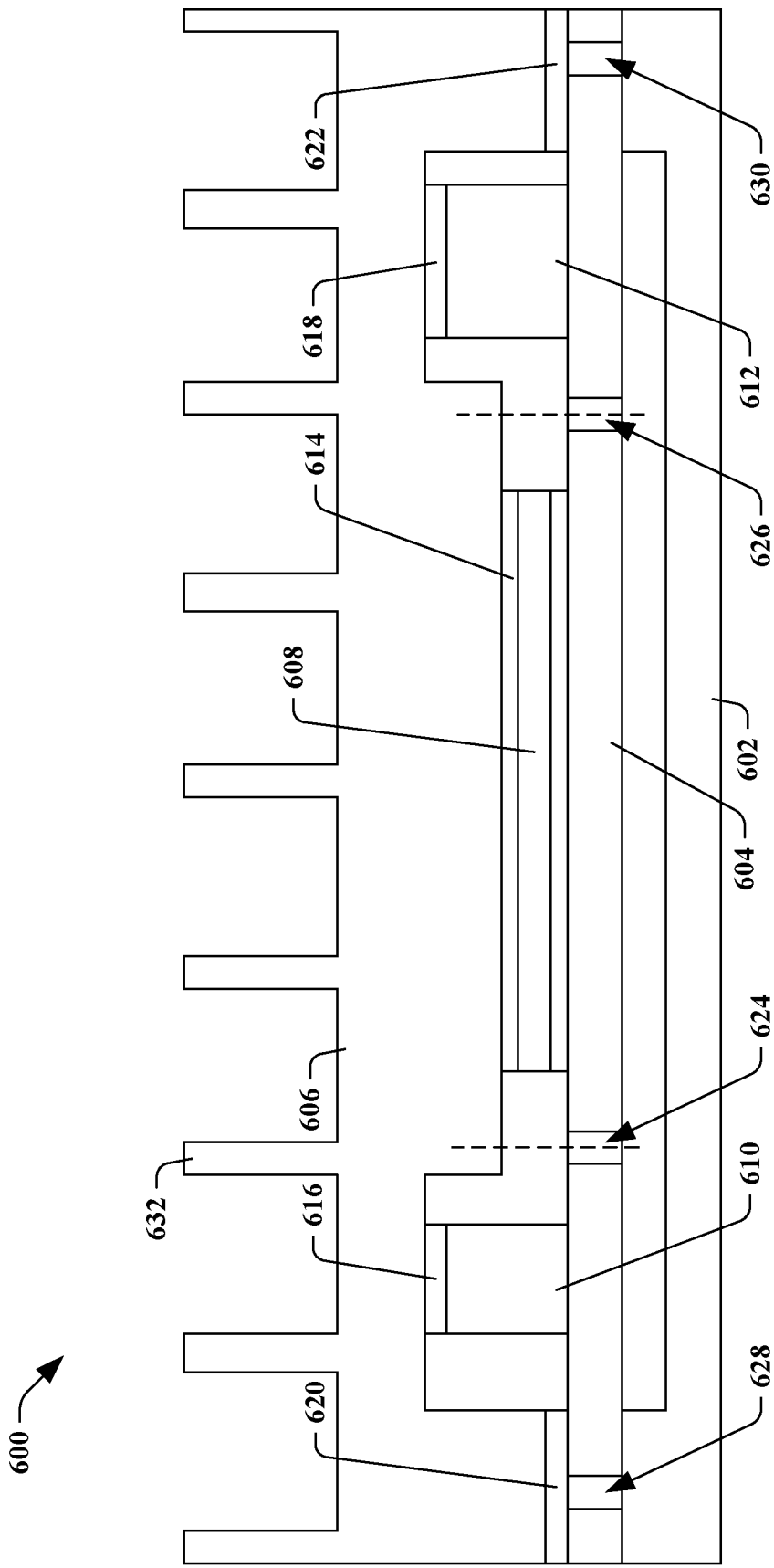
FIG. 6 illustrates a cross-sectional view of another exemplary embodiment of the sensor of FIG. 1.

With reference to FIG. 6, illustrated is a cross-sectional view of another exemplary embodiment of a sensor 600 (e.g., the sensor 100). As depicted in FIG. 6, the sensor 600 includes an enclosure 602, a printed circuit board 604, and a heat sink 606. The sensor 600 has a component referenced design, where the heat sink 606 is referenced to a top of a component 608 on the printed circuit board 604 (e.g., referenced to the lid 504 of the component shown in FIG. 5). The component 608 can be a relatively high power component or a relatively high power density component. According to an illustration, the component 608 can be a GPU, a CPU, an FPGA, or the like. Moreover, although not shown in FIG. 6, in an embodiment where a pedestal is between the heat sink 606 and the top of the component 608 (as shown in FIG. 5), the pedestal can be referenced to the top of the component 608 on the printed circuit board 604.

Moreover, substantially any number of other components can be on the printed circuit board 604. As illustrated, a component 610 and a component 612 are also on the printed circuit board 604. The components 608-612 are on a side of the printed circuit board 604 facing the heat sink 606. While not shown, it is contemplated that the printed circuit board 604 can include component(s) on the side facing the enclosure 602. The component 608 can be a higher power component as compared to the component 610 and the component 612 (e.g., the component 608 may be a primary heat source and the components 610-612 may be secondary heat sources). Moreover, the component 610 and the component 612 can be taller than the higher power component 608; however, the claimed subject matter is not so limited.

The printed circuit board 604 can be the first printed circuit board 108 or the second printed circuit board 110 of the sensor 100. While not shown, in other embodiments it is contemplated that another printed circuit board can be attached to a top side of the heat sink 606. According to an example, the heat sink 606 can be a coldplate (e.g., the coldplate 106) and the enclosure 602 can be a cover (e.g., the top cover 102, the bottom cover 104). Pursuant to another example, the heat sink 606 can be the cover and the enclosure 602 can be the coldplate.

In the example of FIG. 6, the sensor 600 includes a thermal interface material layer 614, a thermal interface material layer 616, a thermal interface material layer 618, a thermal interface material layer 620, and a thermal interface material layer 622. The thermal interface material layers 614-622 fill air gaps between elements. In particular, the thermal interface material layer 614 is between the component 608 and the heat sink 606. The thermal interface material layer 616 is between the component 610 and the heat sink 606. The thermal interface material layer 618 is between the component 612 and the heat sink 606. The thermal interface material layer 620 is between the printed circuit board 604 and the heat sink 606. Likewise, the thermal interface material layer 622 is between the printed circuit board 604 and the heat sink 606. In contrast to including the thermal interface material layers 620-622 between the printed circuit board 604 and the heat sink 606, a printed circuit board referenced design (as shown below) can lack such layers between the printed circuit board 604 and the heat sink 606.

The thermal interface material layers 614-622 can have relatively poor thermal conductivity. Accordingly, the sensor 600 shown in FIG. 6 having the component referenced design (referenced to the top of the component 608) can minimize a thickness of the thermal interface material layer 614 between the component 608 and the heat sink 606 (as compared to a printed circuit board referenced design as described below) to enhance transferring of heat generated by the component 608 to the heat sink 606. The thickness of the thermal interface material layer 614 between the component 608 and the heat sink 606 can be reduced in the example shown in FIG. 6 by having the heat sink 606 referenced to a top of a lid of the component 608. For example, reduction of the thickness of the thermal interface material layer 614 can yield a thermal performance improvement of 4 C as compared to the printed circuit board referenced design described below.

Moreover, the sensor 600 can include proximate mounting holes 624-626 defined through the printed circuit board 604 nearby the component 608. Remote mounting holes 628-630 can also be defined through the printed circuit board 604. The proximate mounting holes 624-626 are located around the component 608 closer than the remote mounting holes 628-630. While two proximate mounting holes 624-626 are shown, it is contemplated that substantially any number of proximate mounting holes can be defined through the printed circuit board 604 (e.g., four). Likewise, while two remote mounting holes 628-630 are defined through the printed circuit board 604, it is to be appreciated that substantially any number of remote mounting holes can be defined through the printed circuit board 604. Moreover, in other embodiments, the printed circuit board 604 can lack the remote mounting holes 628-630 while the proximate mounting holes 624-626 are defined through the printed circuit board 604.

The proximate mounting holes 624-626 are attachment locations at which the printed circuit board 604 is attached to the heat sink 606 in the sensor 600. Springs and/or spring loaded screws can be used above the heat sink 606 and/or below the printed circuit board 604 to attach the printed circuit board 604 to the heat sink 606 (represented by the dashed lines shown in FIG. 6 through the proximate mounting holes 624-626). Accordingly, the following benefits can result as compared to the printed circuit board referenced design described below. The proximate mounting holes 624-626 being nearby and around the component 608 as well as use of the springs and/or spring loaded screws allows for minimizing flex of the printed circuit board 604. The locations of the proximate mounting holes 624-626 and the use of the springs and/or spring loaded screws also provides higher contact pressure between the heat sink 606 and the top of the component 608, which enables the thickness of the thermal interface material layer 614 to be reduced. Moreover, the component referenced design shown in FIG. 6 provides better control of pressure (e.g., between the heat sink 606 and the top of the component 608). The component referenced design of the sensor 600 enables absorbing stack up tolerances of the component 608 and the printed circuit board 604, and so forth.

While not shown in FIG. 6, it is contemplated that the sensor 600 can further use heat pipes, pyrolytic graphite spreaders, vapor chambers, and so forth in combination with the component referenced design. For instance, similar to FIG. 5, a heat spreader (e.g., the heat spreader 502 of FIG. 5, formed of pyrolytic graphite) can also be between the component 608 and the heat sink 606. By way of illustration, rather than the sensor 600 including the thermal interface material layer 614 between the component 608 and the heat sink 606, the first thermal interface material layer 506, the heat spreader 502, and the second thermal interface material layer 508 (of FIG. 5) can be between the component 608 and the heat sink 606.

The sensor 600 also includes fins, such as a fin 632, on the heat sink 606. Accordingly, heat can be transferred from the component 608 (as well as one or more of the components 610-612) to the heat sink 606. The fins can be cooled (e.g., by being exposed to cooler air, liquid, etc.), which in turn can cool the remainder of the heat sink 606. The fins increase a surface area that can be cooled. According to an example, the fins can be internal fins of a coldplate (e.g., an internal structure within the coldplate). Pursuant to another example, the fins can be external fins. It is contemplated, however, that the claimed subject matter is not limited to the heat sink 606 including fins.

Figure 7:
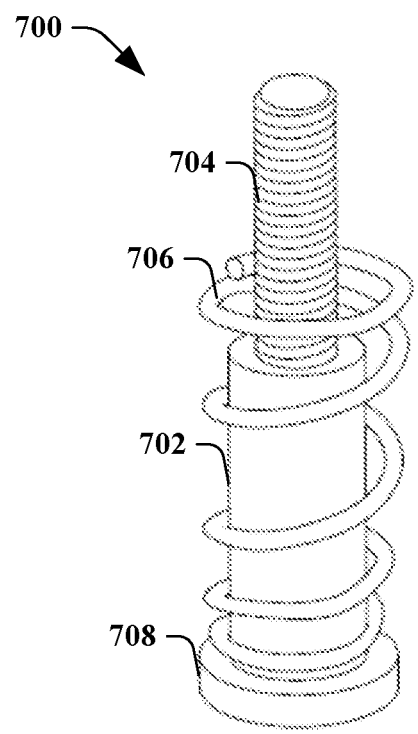
FIG. 7 illustrates a spring loaded screw that can be utilized to mechanically attach a printed circuit board to a heat sink in the sensor of FIG. 6.

FIG. 7 depicts a spring loaded screw 700 that can be utilized to mechanically attach the printed circuit board 604 to the heat sink 606 in the sensor 600 of FIG. 6. The spring loaded screw 700 includes a shaft 702 having a threaded distal end 704. Moreover, the spring loaded screw 700 includes a hex coil 706; the shaft 702 of the spring loaded screw 700 passes through the hex coil 706.

At least a portion of the threaded distal end 704 of the spring loaded screw 700 can be positioned through one of the proximate mounting holes 624-626 through the printed circuit board 604 (e.g., a head 708 of the spring loaded screw 700 can be above the heat sink 606 or below the printed circuit board 604 as shown in FIG. 6). Moreover, when the threaded distal end 704 engages a retention element, such as a nut or some other element that is threaded and engages with the threads on the threaded distal end 704 of the spring loaded screw 700, the hex coil 706 can compress the printed circuit board 604 and the heat sink 606 together. Compression of the printed circuit board 604 and the heat sink 606 in turn can compress the thermal interface material layer 614 between the component 608 and the heat sink 606 in the sensor 600. Thus, spring loaded screws such as the spring loaded screw 700 passing through the proximate mounting holes 624-626 can provide pressure adjacent to the component 608 from which it is desired to dissipate heat.

Figure 8:
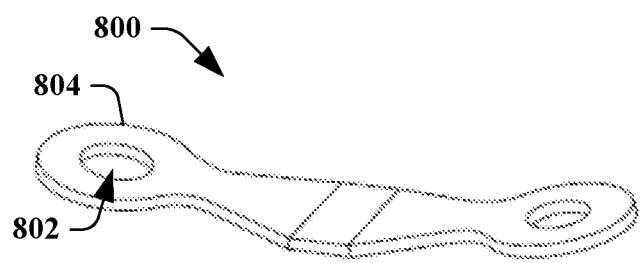
FIG. 8 illustrates a leaf spring that can be used to compress the printed circuit board together with the heat sink in the sensor of FIG. 6.

FIG. 8 illustrates a leaf spring 800 that can additionally or alternatively be used to compress the printed circuit board 604 together with the heat sink 606. Similar to above, the leaf spring 800 can be above the heat sink 606 or below the printed circuit board 604 of the sensor 600 of FIG. 6. According to an example, a screw can pass through an opening 802 of the leaf spring 800 (and further through one of the proximate mounting holes 624-626). When the screw is tightened, an arm 804 of the leaf spring 800 can be deflected, which can cause the printed circuit board 604 and the heat sink 606 to be compressed together. Again, compression of the printed circuit board 604 and the heat sink 606 in turn can compress the thermal interface material layer 614 between the component 608 and the heat sink 606 in the sensor 600.

Figure 9:
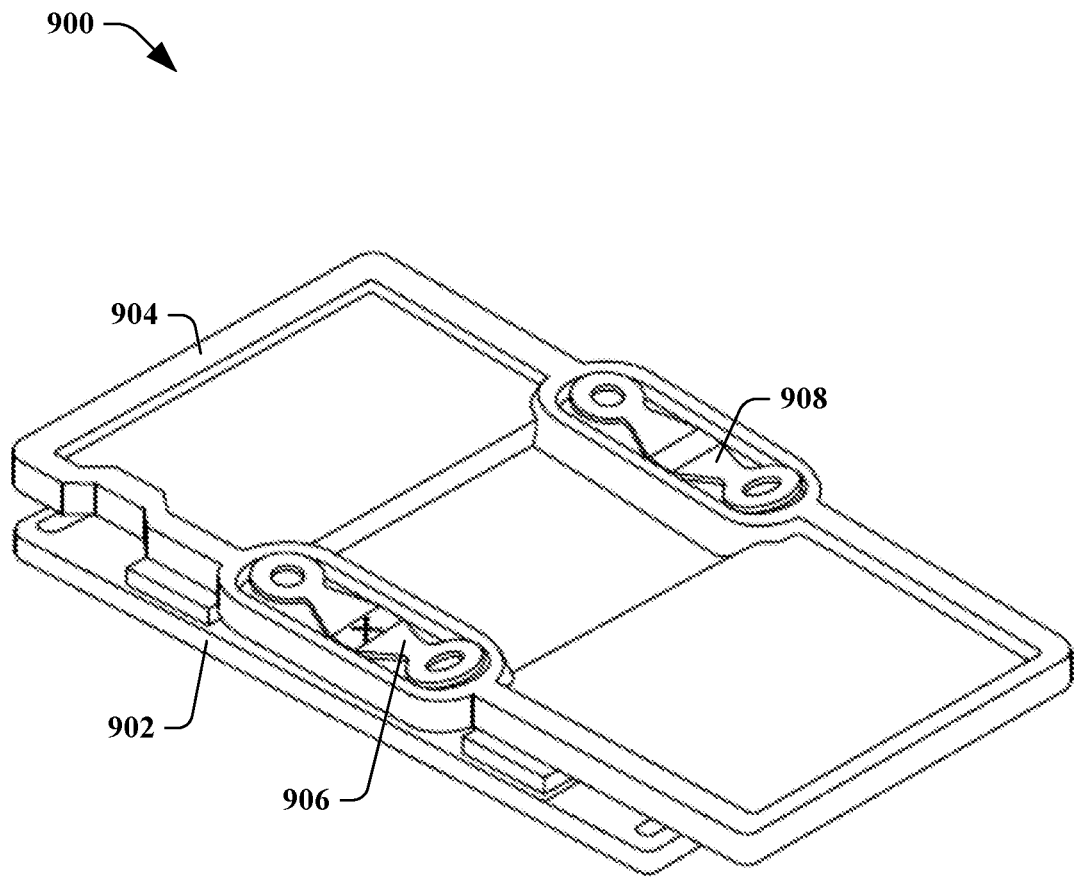
FIG. 9 illustrates a portion of a sensor that includes leaf springs.

An exemplary portion 900 of a sensor (e.g., the sensor 100, the sensor 600) is depicted in FIG. 9. In particular, FIG. 9 shows a printed circuit board 902 (e.g., the printed circuit board 604) and a heat sink 904 (e.g., the heat sink 606). Further depicted are a leaf spring 906 and a leaf spring 908, each of which can be substantially similar to the leaf spring 800 of FIG. 8. The leaf springs 906-908 are positioned above the heat sink 904. Accordingly, the leaf springs 906-908 can be used to compress the printed circuit board 902 and the heat sink 904 together. For example, screws can pass through openings of the leaf springs 906-908 as well as corresponding proximate mounting holes through the printed circuit board 904; when the screws are tightened (e.g., via nuts or some other type of element that engages the screws), the arms of the leaf springs 906-908 can be deflected to compress the printed circuit board 902 and the heat sink 904 together. It is contemplated, however, that other types of attachment mechanisms can be utilized other than screws. Moreover, the claimed subject matter is not limited to the locations of the leaf springs 906-908 relative to the heat sink 904 shown in FIG. 9; rather, the locations of the leaf springs 906-908 can be dependent upon a location of a particular component on the printed circuit board 902 (and thus, locations of the proximate mounting holes through the printed circuit board 904). Further, it is contemplated that the leaf springs 906-908 can alternatively be below the printed circuit board 902 as opposed to above the heat sink 904 as depicted in FIG. 9.

It is to be appreciated, however, that other types of springs and/or spring loaded screws are intended to fall within the scope of the hereto appended claims. Accordingly, the claimed subject matter is not limited to the examples shown in FIGS. 7-9.

Figure 10:
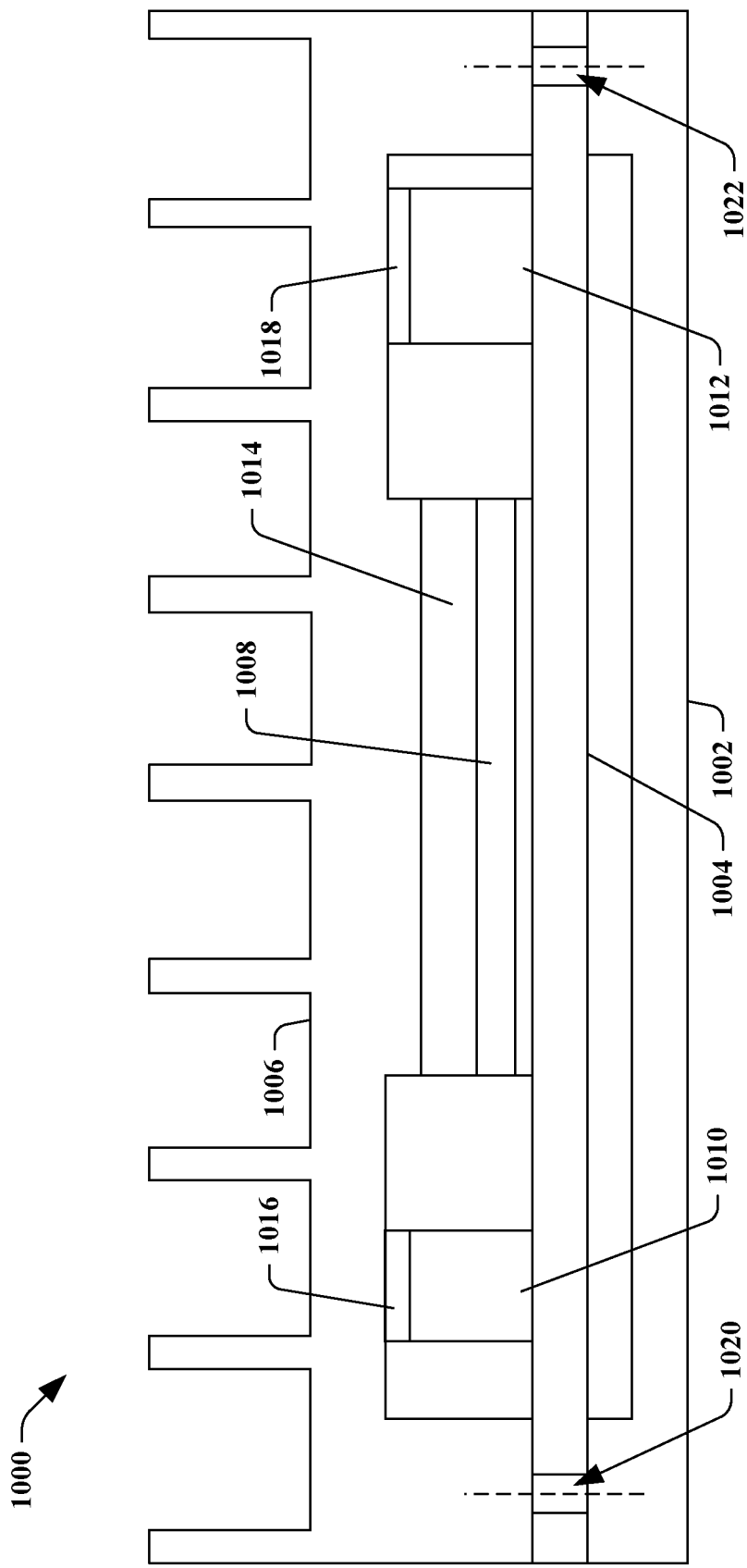
FIG. 10 illustrates a cross-sectional view of an exemplary sensor having a printed circuit board referenced design.

Now referring to FIG. 10, illustrated is a cross-sectional view of an exemplary sensor 1000 having a printed circuit board referenced design. The sensor 1000 includes an enclosure 1002, a printed circuit board 1004, and a heat sink 1006. Similar to the sensor 600 of FIG. 6, a component 1008, a component 1010, and a component 1012 can be on the printed circuit board 1004. Moreover, a thermal interface material layer 1014 can be between the component 1008 and the heat sink 1006, a thermal interface material layer 1016 can be between the component 1010 and the heat sink 1006, and a thermal interface material layer 1018 can be between the component 1012 and the heat sink 1006. Further, remote mounting holes 1020-1022 can be defined through the printed circuit board 1004; thus, remote mounting holes 1020-1022 can be attachment locations in the sensor 1000 (e.g., locations at which at least the printed circuit board 1004 is attached to the heat sink 1006).

In the sensor 1000, the heat sink 1006 is referenced to a top of the printed circuit board 1004 (e.g., the sensor 1000 can lack thermal interface material layers between the printed circuit board 1004 and the heat sink 1006 similar to the thermal interface material layers 620 and 622 of FIG. 6). Moreover, the thermal interface material layer 1014 between the component 1008 and the heat sink 1006 can be thicker than the thermal interface material layer 614 between the component 608 and the heat sink 606 in the sensor 600 of FIG. 6. For instance, the thickness of the thermal interface material layer 1016 can be dependent on tolerance stack up. According to an example, a tolerance loop can include a package height and a heat sink base height.

Comparing the sensor 600 of FIG. 6 to the sensor 1000 of FIG. 10, the sensor 600 can provide improved thermal performance as compared to the sensor 1000. Since the thickness of the thermal interface material layer 614 of the sensor 600 is reduced relative to the thickness of the thermal interface material layer 1014 of the sensor 1000, thermal conductivity from the component 608 to the heat sink 606 can be improved as compared to the sensor 1000 having the printed circuit board referenced design. Moreover, as compared to the sensor 1000, the sensor 600 can have attachment locations (e.g., via the proximate mounting holes 624-626) that are closer to the component 608, which can enhance compression of the thermal interface material layer 614 between the component 608 and the heat sink 606 (e.g., further reducing the thickness of the thermal interface material layer 614).

Figure 11:
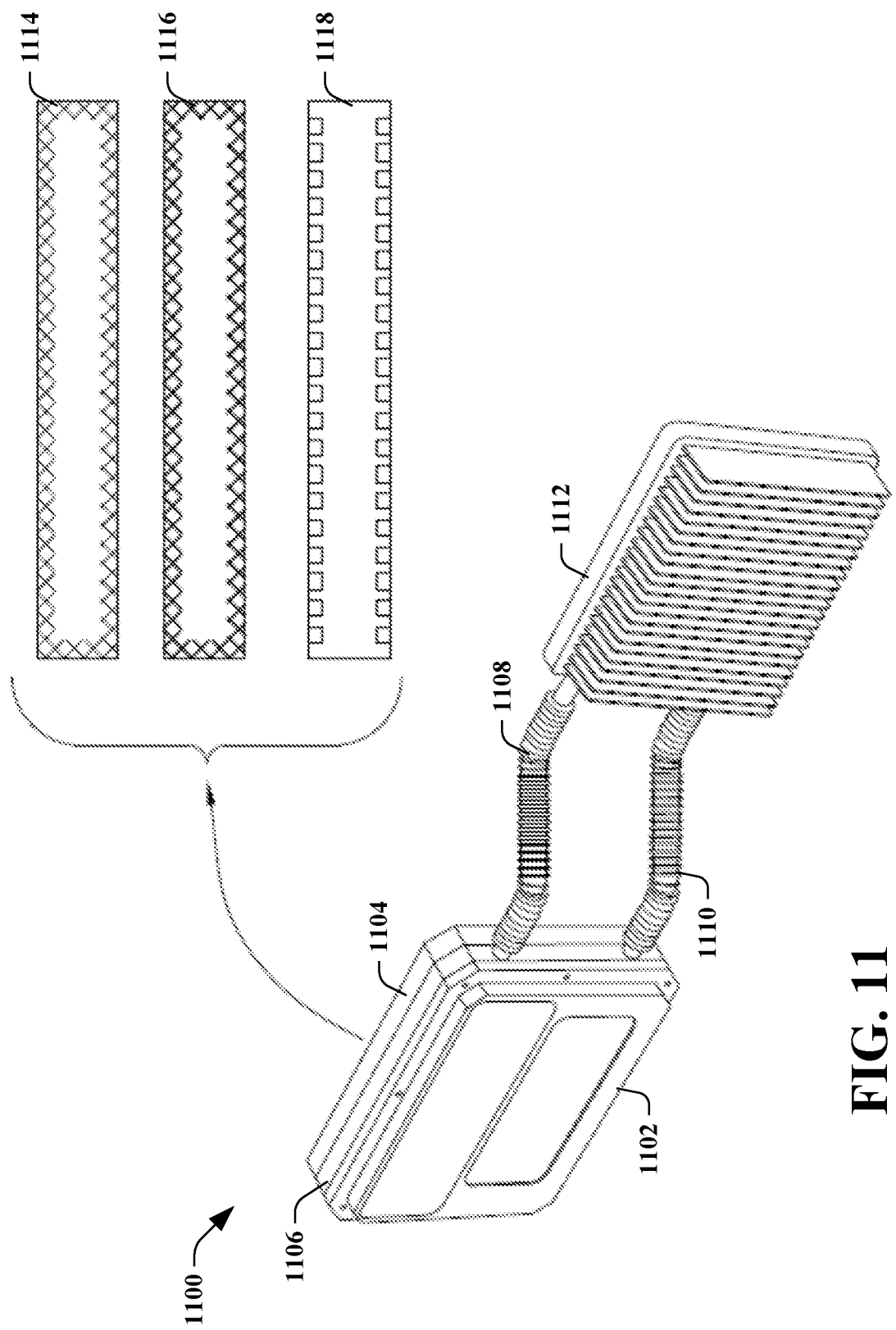
FIG. 11 illustrates an exemplary embodiment of the sensor of FIG. 1 that includes a flexible two-phase heat sink.

With reference to FIG. 11, illustrated is another exemplary sensor 1100 (e.g., the sensor 100). The sensor 1100 includes a flexible two-phase heat sink. Similar to above, the sensor 1100 can include a top cover 1102 (e.g., the top cover 102), a bottom cover 1104 (e.g., the bottom cover 104), and a coldplate 1106 (e.g., the coldplate 106, a thermal transfer plate). Although not shown in FIG. 11, a first printed circuit board (e.g., the first printed circuit board 108) can be between the top cover 1102 and the coldplate 1106, and a second printed circuit board (e.g., the second printed circuit board 110) can be between the bottom cover 1104 and the coldplate 1106. Similar to above, components on the printed circuit boards can make contact with the coldplate 1106, the top cover 1102, or the bottom cover 1104 (e.g., directly or indirectly contact via thermal interface material layers, pedestals, etc.).

In various embodiments, a coldplate can have connection(s) with a top cover and a bottom cover of a sensor. Accordingly, heat can flow from at least some components on the printed circuit board to the coldplate, and from the coldplate to the top cover and bottom cover. Yet, depending on the location of the sensor (e.g., a location within an autonomous vehicle), the sensor may not be easily accessible for cooling. For example, if the sensor is located near an engine of an autonomous vehicle, the sensor may be exposed to air at relatively high temperatures (as compared to air in an environment in which the autonomous vehicle is located). Following this example, it may be challenging to have the sensor exposed to cooled fresh air to cool the top cover and the bottom cover of the sensor.

The sensor 1100 of FIG. 11 can be a two-phase heat transfer device with flexible tubing which enables having a heat sink in a remote location that is more accessible for cooling. The sensor 1100 includes a flexible vapor line 1108, a flexible liquid line 1110, and a remote heat sink 1112. A first end of the flexible vapor line 1108 is coupled to the coldplate 1106 and a second end of the flexible vapor line 1108 is coupled to the remote heat sink 1112. Moreover, a first end of the flexible liquid line 1110 is coupled to the remote heat sink 1112 and a second end of the flexible liquid line 1110 is coupled to the coldplate 1106. Accordingly, the remote heat sink 1112 can be located at a position remote from the top cover 1102, the bottom cover 1104, and the coldplate 1106 (as well as the printed circuit board(s) enclosed therein) (e.g., at a position that is more accessible to cooler air). By way of illustration, the top cover 1102, the bottom cover 1104, and the coldplate 1106 (and the contents enclosed therein) can be located near an engine of an autonomous vehicle. Further following this example, the remote heat sink 1112 can be located at a differing position in the autonomous vehicle, such that cooled fresh air can reach the remote heat sink 1112. Moreover, the flexible vapor line 1108 and the flexible liquid line 1110 can connect the remote heat sink 1112 and the coldplate 1106.

The coldplate 1106 of the sensor 1100 can be a two-phase cooling plate. The coldplate 1106 can be or include a vapor chamber. Thus, the coldplate 1106 can be or include a hollow chamber under vacuum that includes a working fluid (e.g., that can change from liquid to vapor as well as from vapor to liquid). It is contemplated that the flexible vapor line 1108, the flexible liquid line 1110, and the remote heat sink 1112 can also be under vacuum.

The coldplate 1106 can have a wick structure. Examples of the wick structure of the coldplate 1106 include a mesh structure 1114, a sintered structure 1116, or a pillar/channel structure 1118. However, other types of wick structures are intended to fall within the scope of the hereto appended claims. The wick structure can enable the liquid to spread within the coldplate 1106; thus, heat from a component on a printed circuit board adjacent to the coldplate 1106 can cause the liquid to evaporate to a vapor.

The flexible vapor line 1108 can be a flexible tube. The flexible vapor line 1108 can lack an internal structure so as to minimize resistance for vapor flow from the first end coupled to the coldplate 1106 to the second end coupled to the remote heat sink 1112. Thus, the flexible vapor line 1108 can be a hollow tube.

The flexible liquid line 1110 can likewise be a flexible tube. The flexible liquid line 1110 can comprise an internal structure, such as a sintered structure or a mesh structure (e.g., the flexible liquid line 1110 can be filled with the internal structure). The internal structure of the flexible liquid line 1110 can enhance providing a continuous liquid supply to the coldplate 1106. Thus, the internal structure of the flexible liquid line 1110 can facilitate transferring of liquid from the first end coupled to the remote heat sink 1112 to the second end coupled to the coldplate 1106.

The remote heat sink 1112 can include fins. Air can cool the fins of the remote heat sink 1112, which in turn can cause a vapor retained in the remote heat sink 1112 to condense to a liquid. Moreover, according to various embodiments, it is contemplated that the remote heat sink 1112 can have a structure similar to the coldplate 1112 (e.g., the remote heat sink 1112 can have a wick structure, the structure of the remote heat sink 1112 can address temperature uniformity issues that may exist at a location of the remote heat sink 1112).

Liquid can be vaporized over a heat source (e.g., a component on a printed circuit board) in the coldplate 1106. The vapor can then travel through the flexible vapor line 1108 to the remote heat sink 1112. Since the remote heat sink 1112 can be exposed to air at a cooler temperature, the remote heat sink 1112 can condense the vapor back to liquid. The liquid can then be passed from the remote heat sink 1112 back to the coldplate 1106 through the flexible liquid line 1110. Accordingly, the coldplate 1106, the flexible vapor line 1108, the remote heat sink 1112, and the flexible liquid line 1110 can form a loop through which the working fluid can flow in the two phases (e.g., vapor and liquid).

Accordingly, the sensor 1100 of FIG. 11 can be an efficient two-phase heat transfer device that can assist in cooling the components on the printed circuit board(s). Further, the sensor 1100 can be less constrained with cooling capacity of certain locations within an autonomous vehicle since the remote heat sink 1112 can be at positioned in a remote location accessible to cooler air (e.g., cooling need not be constrained by the location of the top cover 1102, the bottom cover 1104, the coldplate 1106, and the contents therein).

Figure 12:
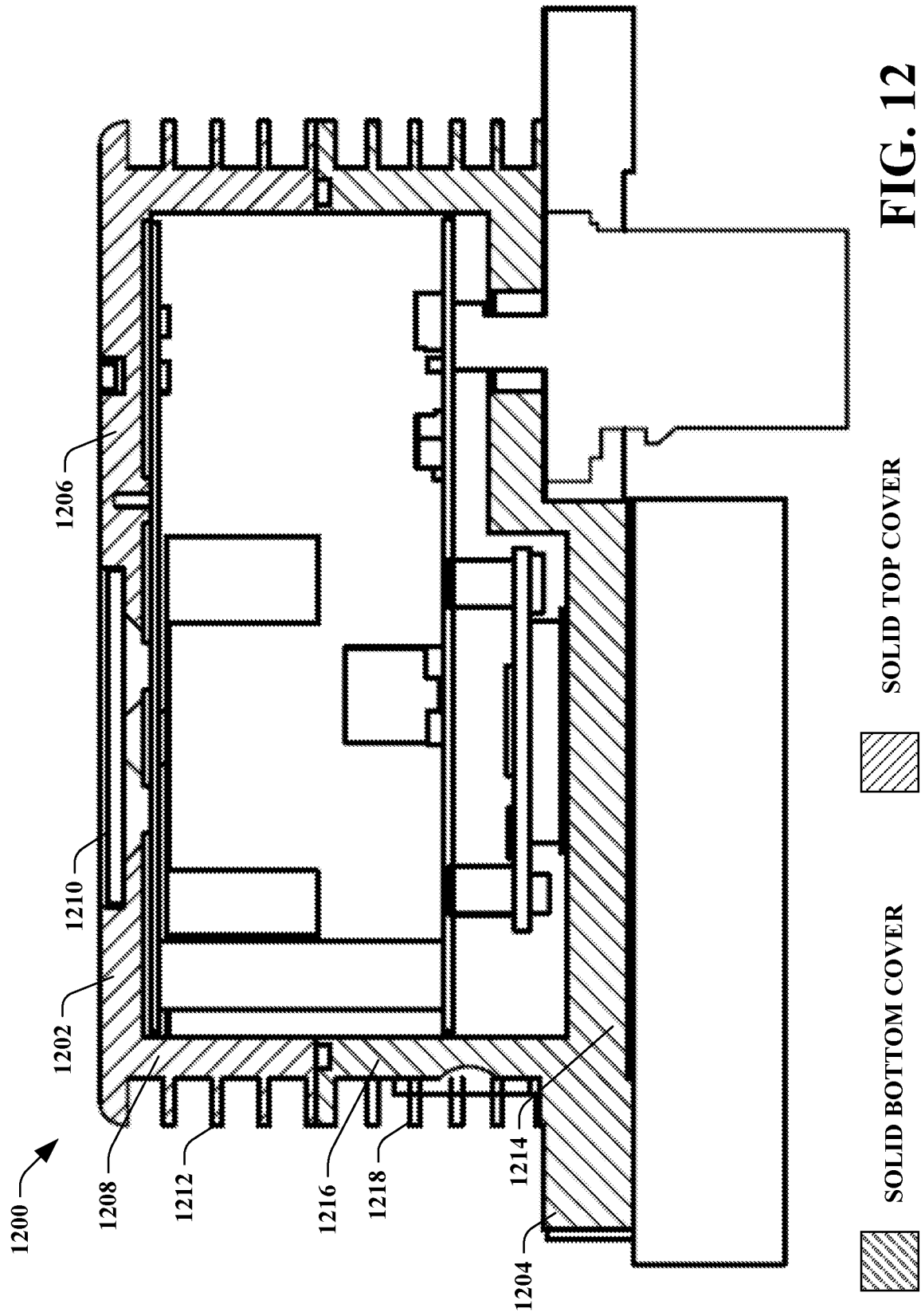
FIG. 12 illustrates a cross-sectional view of an exemplary embodiment of the sensor of FIG. 1.

Now referring to FIG. 12, illustrated is a cross-sectional view of another exemplary sensor 1200. The sensor 1200 includes a top cover 1202 (e.g., the top cover 102) and a bottom cover 1204 (e.g., the bottom cover 104). The top cover 1202 and the bottom cover 1204 are mechanically coupled as depicted in FIG. 12 to form a casing. As described herein, the casing formed by the top cover 1202 and the bottom cover 1204 can house one or more printed circuit boards (e.g., the printed circuit boards 108 and 110), a coldplate (e.g., the coldplate 106), and so forth. While not shown in FIG. 12, it is contemplated that the top cover 1202 and the bottom cover 1204 can be mechanically coupled to a coldplate positioned therebetween as described in various embodiments herein (e.g., an exterior edge of the coldplate can form part of the exterior of the casing).

The casing shown in FIG. 12 is a solid casing. The top cover 1202 and the bottom cover 1204 can both be formed of solid metal. According to an example, the top cover 1202 and the bottom cover 1204 can be formed of aluminum. Following this example, aluminum can have a high thermal conductivity and can be beneficial for heat transfer. Yet, it is contemplated that the top cover 1202 and the bottom cover 1204 being formed of other types of metal is intended to fall within the scope of the hereto appended claims (e.g., copper, etc.).

In the example shown in FIG. 12, the top cover 1202 includes a top 1206 and a side 1208. The top 1206 of the top cover 1202 can include a window 1210. Moreover, fins (such as a fin 1212) can be formed as part of the side 1208 of the top cover 1202. Further, the bottom cover 1204 can include a bottom 1214 and a side 1216. Fins (such as a fin 1218) can be formed as part of the side 1216 of the bottom cover 1204.

Figure 13:
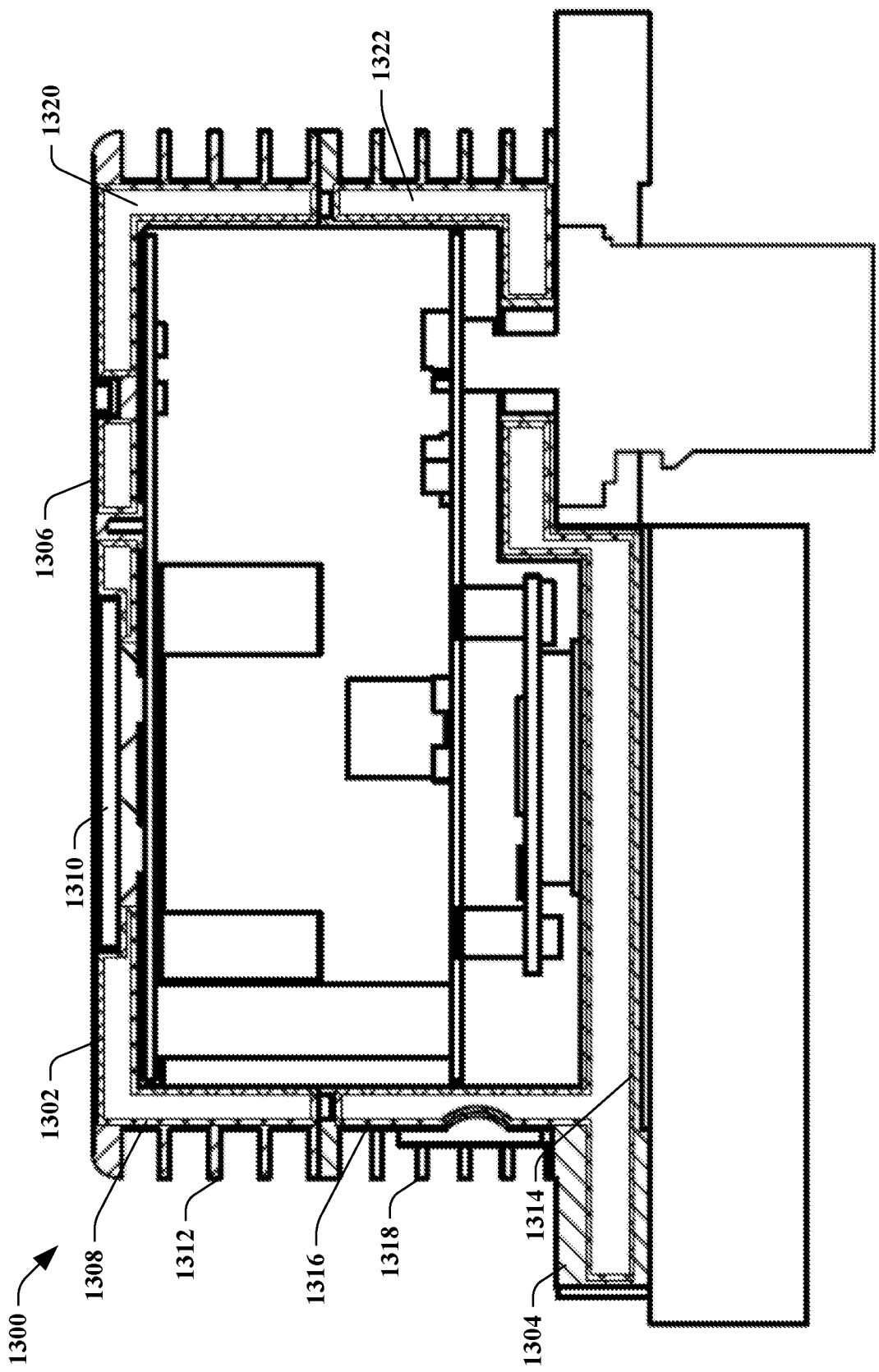
FIG. 13 illustrates a cross-sectional view of another exemplary embodiment of the sensor of FIG. 1.

Turning to FIG. 13, illustrated is a cross-sectional view of yet another exemplary sensor 1300. Similar to the sensor 1200 of FIG. 12, the sensor 1300 includes a top cover 1302 (e.g., the top cover 102) and a bottom cover 1304 (e.g., the bottom cover 104), which are mechanically coupled to form a casing. The casing again can house one or more printed circuit boards (e.g., the printed circuit boards 108 and 110), a coldplate (e.g., the coldplate 106), and the like. Although not shown in FIG. 13, the top cover 1302 and the bottom cover 1304 can be mechanically coupled to a coldplate positioned therebetween. Further, the top cover 1302 includes a top 1306 and a side 1308. A window 1310 can be included as part of the top 1306 of the top cover 1302 and fins (such as a fin 1312) can be included as part of the side 1308 of the top cover 1302. Moreover, the bottom cover 1304 includes a bottom 1314 and a side 1316; fins (such as a fin 1318) can be formed as part of the side 1316 of the bottom cover 1304.

In contrast to the solid casing of the sensor 1200, the top cover 1302 can include a vapor chamber 1320 and the bottom cover 1304 can include a vapor chamber 1322 (e.g., the vapor chamber 1320 can be defined within the top cover 1302 and the vapor chamber 1322 can be defined within the bottom cover 1304). The following describes the vapor chamber 1320 of the top cover 1302; it is to be appreciated that the vapor chamber 1322 of the bottom cover 1304 can be substantially similar. The vapor chamber 1320 is a passive two-phase heat transfer device. The vapor chamber 1320 can be or include a sealed hollow container filled with an amount of a working fluid (e.g., a relatively small amount of the working fluid). For instance, walls of the top cover 1302 can define the sealed hollow container. The vapor chamber 1320 has a unibody design (e.g., the top cover 1302 is a single structural unit that defines the vapor chamber 1320). The vapor chamber 1320 can be under vacuum. Moreover, the walls of the top cover 1302 can be formed of aluminum; yet, it is contemplated that other materials are intended to fall within the scope of the hereto appended claims (e.g., copper, etc.). The working fluid included in the vapor chamber 1320 evaporates over a heat source (e.g., a particular component on a printed circuit board) and condenses in colder areas (e.g., a location at a distance from the particular component on the printed circuit board). The vapor chamber 1320 can include a wick structure. The wick structure can bring the condensed working fluid back over the heat source. According to an example, a component on a printed circuit board can generate heat, which can heat the liquid in the vapor chamber 1320 of the top cover 1302 at a location adjacent to the component thereby causing the liquid to turn to a vapor. By including the vapor chamber 1320, the top cover 1302 can provide a larger surface area for natural convection heat transfer for the sensor 1300 as compared to the sensor 1200. Moreover, as compared to the sensor 1200 of FIG. 12, the use of the vapor chamber 1320 can mitigate hot spots from component(s) with large heat fluxes. Thus, use of the vapor chamber 1320 can provide enhanced thermal management under natural convection scenarios.

Heat dissipation without a vapor chamber can be relatively localized. Some spreading of heat on a casing can result due to the type of material from which the casing is formed. Thus, hot spots can exist in a casing at locations contacted by components having relatively higher power densities. Thus, the vapor chambers 1320 and 1322 can enhance distributing heat over a larger area.

Figure 14:
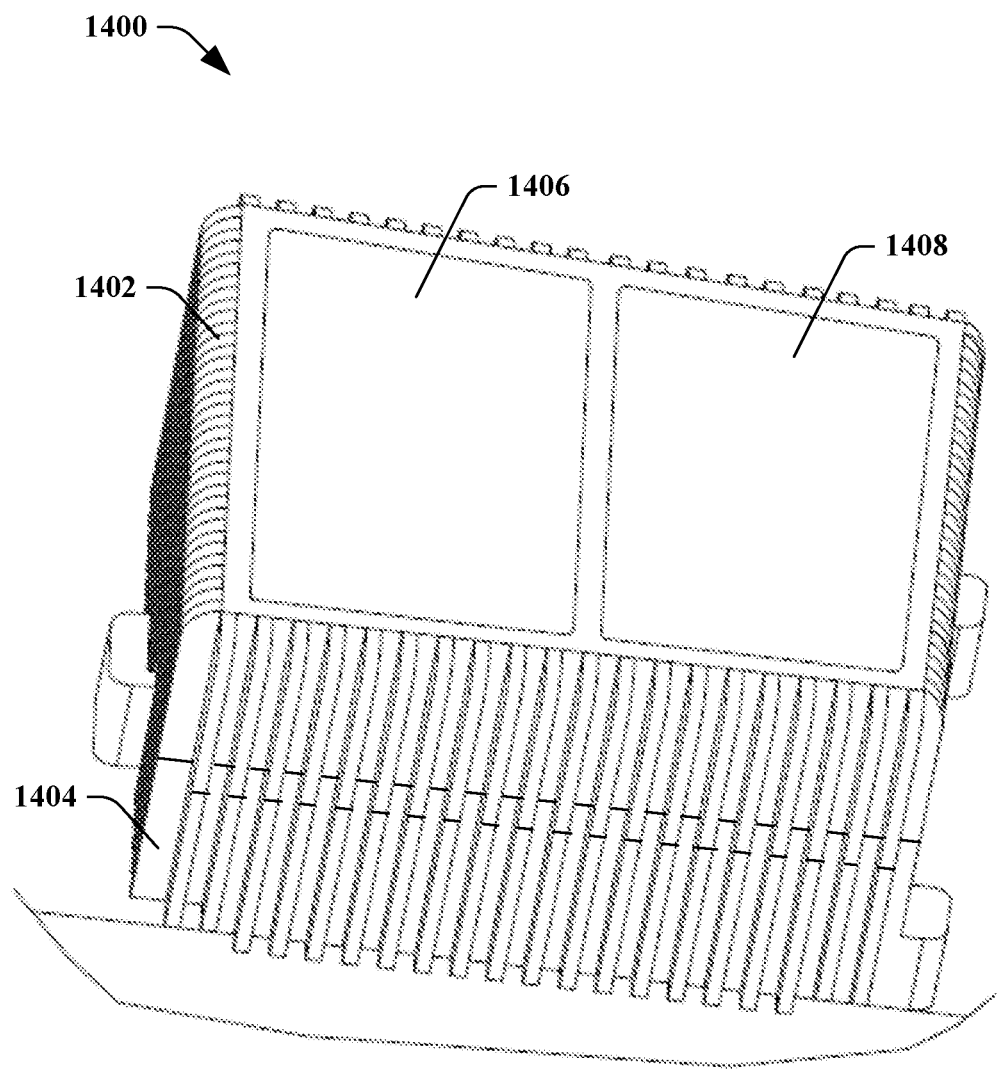
FIG. 14 illustrates a perspective view of another exemplary embodiment of the sensor of FIG. 1.

With reference to FIG. 14, illustrated is a perspective view of another exemplary sensor 1400 (e.g., the sensor 100). A top cover 1402 (e.g., the top cover 102) and a bottom cover 1404 (e.g., the bottom cover 104) are mechanically coupled in FIG. 14. Moreover, the top cover 1402 includes two windows 1406-1408; yet, in other embodiments, it is to be appreciated that the top cover 1402 can include one window or more than two windows.

According to various embodiments, a coating for self-cleaning and enhanced thermal performance can be applied to the sensor 1400. The coating can be an antimony doped tin oxide (ATO) coating. The ATO coating can be applied to the windows 1406-1408 of the sensor 1400. For example, the ATO coating can be applied by spraying the coating on the sensor 1400 (e.g., spraying the coating on the windows 1406-1408), dipping the sensor 1400 into an ATO solution, or the like.

The ATO coating can block inlet infrared (IR) light from the sun. A significant portion of the heat gain within sensors can be due to solar loading. Thus, blocking the IR light from the sun can lower the passive heating load and assist in lowering temperatures of components in the sensors. For instance, the ATO coating applied to the windows 1406-1408 of the sensor 1400 can reduce a portion of the IR light from the sun (e.g., 90% of the IR light can be inhibited from passing through the ATO coating), while a significant portion of visible light can pass through the ATO coating (e.g., 80% of the visible light can pass through the ATO coating). Accordingly, the sensor 1400 can properly function with the ATO coating applied to the windows 1406-1408.

Moreover, the ATO coating can have superhydrophobic properties for self-cleaning. For instance, when a sensor is incorporated in an autonomous vehicle, dirt, mud, snow, ice, and the like can cause blockage of a field of view (e.g., mud can obstruct a window of a sensor) which can result in a malfunction of a sensor. In contrast, the superhydrophobic properties of the ATO coating applied to the windows 1406-1408 can cause self-cleaning of the windows 1406-1408. According to an illustration, when dirty water comes in contact with the windows 1406-1408 having the ATO coating applied thereto, the hydrophobic nature of the ATO coating can cause the water to roll off the windows 1406-1408.

While an ATO coating is described above, it is contemplated that other types of coatings with similar properties (e.g., blocks IR light, allows visible light to pass, and hydrophobic to provide self-cleaning) can alternatively be utilized to coat the windows 1406-1408 of the sensor 1400.

Figure 15:
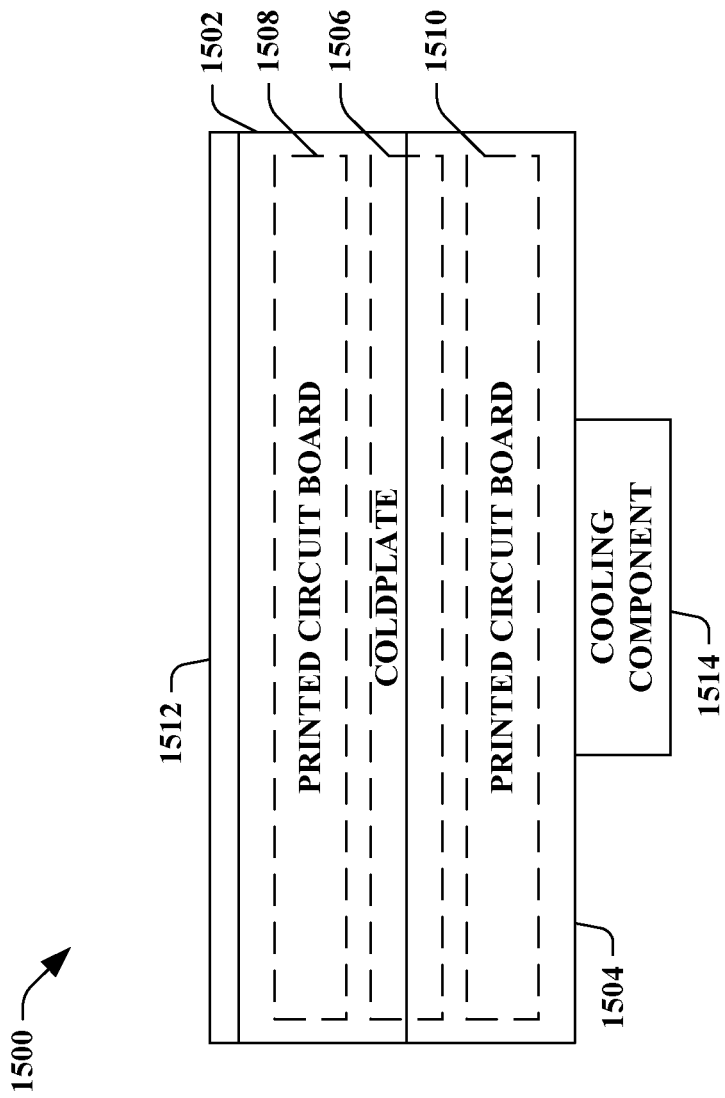
FIG. 15 illustrates another exemplary embodiment of the sensor of FIG. 1.

Now turning to FIG. 15, illustrated is another exemplary sensor 1500 (e.g., the sensor 100). The sensor 1500 again includes a top cover 1502 (e.g., the top cover 102) and a bottom cover 1504 (e.g., the bottom cover), which form a casing when mechanically coupled. A coldplate 1506 (e.g., the coldplate 106) as well as one or more printed circuit boards can be retained within the casing formed by the top cover 1502 and the bottom cover 1504; as depicted, a first printed circuit board 1508 (e.g., the first printed circuit board 108) and a second printed circuit board 1510 (e.g., the second printed circuit board 108) can be within the casing formed by the top cover 1502 and the bottom cover 1504. In other embodiments, it is contemplated that the top cover 1502 and the bottom cover 1504 can be mechanically coupled to the coldplate 1506 positioned therebetween (e.g., an exterior edge of the coldplate 1506 can form a portion of the casing as opposed to the coldplate 1506 being fully housed within the casing formed by the top cover 1502 and the bottom cover 1504).

The sensor 1500 further includes a solar panel 1512 and a cooling component 1514. The solar panel 1512 can be mounted to, integrated into, or otherwise affixed to the casing formed by the top cover 1502 and the bottom cover 1504. For instance, the solar panel 1512 can be on a top of the top cover 1502. It is to be appreciated that substantially any size solar panel 1512 relative to a size of the top cover 1502 is intended to fall within the scope of the hereto appended claims. According to various embodiments, the cooling component 1514 can be positioned outside of the casing formed by the top cover 1502 and the bottom cover 1504, but can supply cooled air into the casing. Pursuant to other embodiments, the cooling component 1514 can be housed at least partially within the casing formed from the top cover 1502 and the bottom cover 1504. Examples of the cooling component 1514 include a fan, a pump, a blower, a thermal electric cooler (TEC), or the like.

Solar load can be a significant source of heat for a sensor in addition to heat generated by the sensor itself. Accordingly, the solar panel 1512 can be included as part of the sensor 1500 to at least partially block solar radiation as well as to covert the solar radiation incident upon the solar panel 1512 to electricity. The electricity can power the cooling component 1514, which in turn can cool the sensor 1500. The electricity generated by the solar panel 1512 can additionally or alternatively power operation of the sensor 1500 itself. According to an embodiment, it is contemplated that the sensor 1500 can lack the cooling component 1514; thus, following such an embodiment, the electricity generated by the solar panel 1512 can be employed for operation of the sensor 1500 (e.g., the sensor 1500 need not be powered by a battery of an autonomous vehicle, the sensor 1500 may be partially powered by the battery of the autonomous vehicle and partially powered by the electricity from the solar panel 1512).

Figure 16:
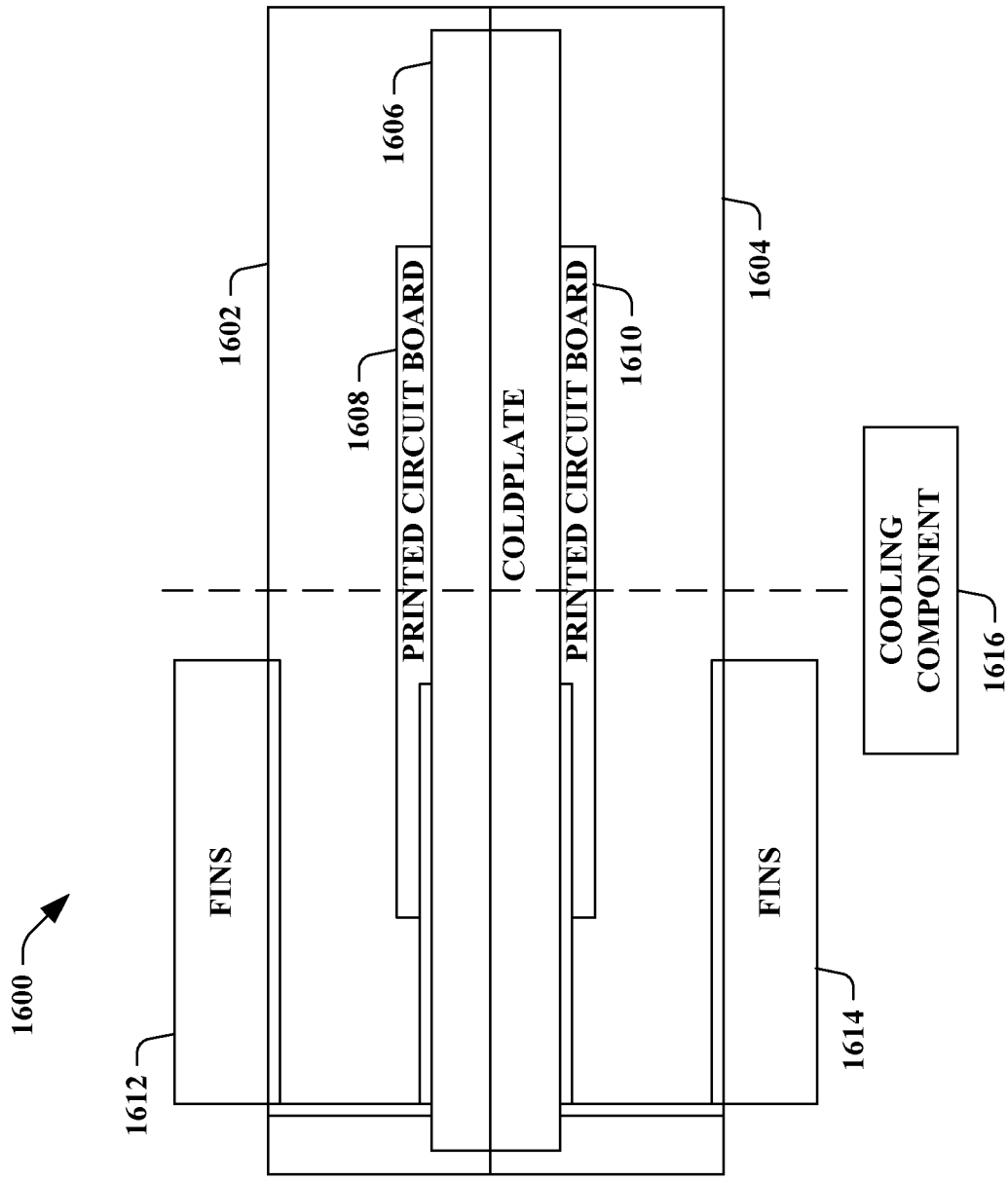
FIG. 16 illustrates yet another exemplary embodiment of the sensor of FIG. 1.

With reference to FIG. 16, illustrated is yet another exemplary sensor 1600. The sensor 1600 has hybrid air and liquid cooling. Again, the sensor 1600 can include a top cover 1602 (e.g., the top cover 102), a bottom cover 1604 (e.g., the bottom cover 104), a coldplate 1606 (e.g., the coldplate 106), a first printed circuit board 1608 (e.g., the first printed circuit board 108), and a second printed circuit board 1610 (e.g., the second printed circuit board 110). The sensor 1600 can further have fins 1612 on the top cover 1602 and fins 1614 on the bottom cover 1604. The sensor 1600 also includes a cooling component 1616 configured to cool the sensor 1600 by air cooling. Examples of the cooling component 1616 include a fan, a pump, a blower, a thermal electric cooler (TEC), or the like.

The coldplate 1606 can be a liquid cooled coldplate with internal fins. The sensor 1600 can be primarily cooled by liquid. However, if there is a potential failure or leak in the liquid cooling loop, the sensor 1600 includes a redundant or backup path to cool the sensor 1600 (e.g., partially cool, fully cool), namely, the cooling component 1616 which cools the sensor by air cooling. For instance, the cooling component 1616 can cool a primary and/or secondary compute stack in case there is a failure to the primary liquid cooling path. The cooling component 1616 can be initiated (to start air cooling) upon detection of a failure of liquid cooling in the coldplate 1606.

Accordingly, the sensor 1600 can employ a combined air and liquid cooled thermal solution to cool common components (e.g., on the printed circuit board 1608 and/or the printed circuit board 1610). Moreover, the air and liquid cooled thermal solutions can co-exist and supplement each other for cooling the sensor 1600.

Pursuant to various examples, a heat pipe (e.g., in the coldplate 1606, between the coldplate and the fins 1612 or 1614) can become clogged due to debris or a pump may fail; thus, a working fluid may be inhibited from flowing through the sensor 1606 (e.g., within the coldplate 1606, between the coldplate 1606 and the fins 1612-1614). Failure of the liquid cooling solution can be detected, which can initiate switching on the cooling component 1616 (e.g., starting a blower to cause air to be blown into the sensor 1600). Thus, the cooling component 1616 can be a failover system in various embodiments.

It is also contemplated that the cooling component 1616 can be utilized with other conditions are detected in the sensor 1600. For instance, if a temperature of a particular component (e.g., a CPU, a GPU, etc.) on one of the printed circuit boards 1608-1610 is detected to be above a threshold temperature, then the cooling component 1616 can be started to assist in cooling the sensor 1600 (e.g., to assist in cooling the particular component). Thus, in some scenarios, it is contemplated that air and liquid cooling can occur simultaneously (e.g., the air cooling can be employed without failure of the liquid cooling). Pursuant to yet other examples, it is contemplated that liquid cooling and air cooling can be selectively enabled based on overall power management (e.g., temperature within the sensor 1600 or of a particular component in the sensor 1600 can be balanced with power consumption for operating the liquid cooling and/or air cooling).

Figure 17:
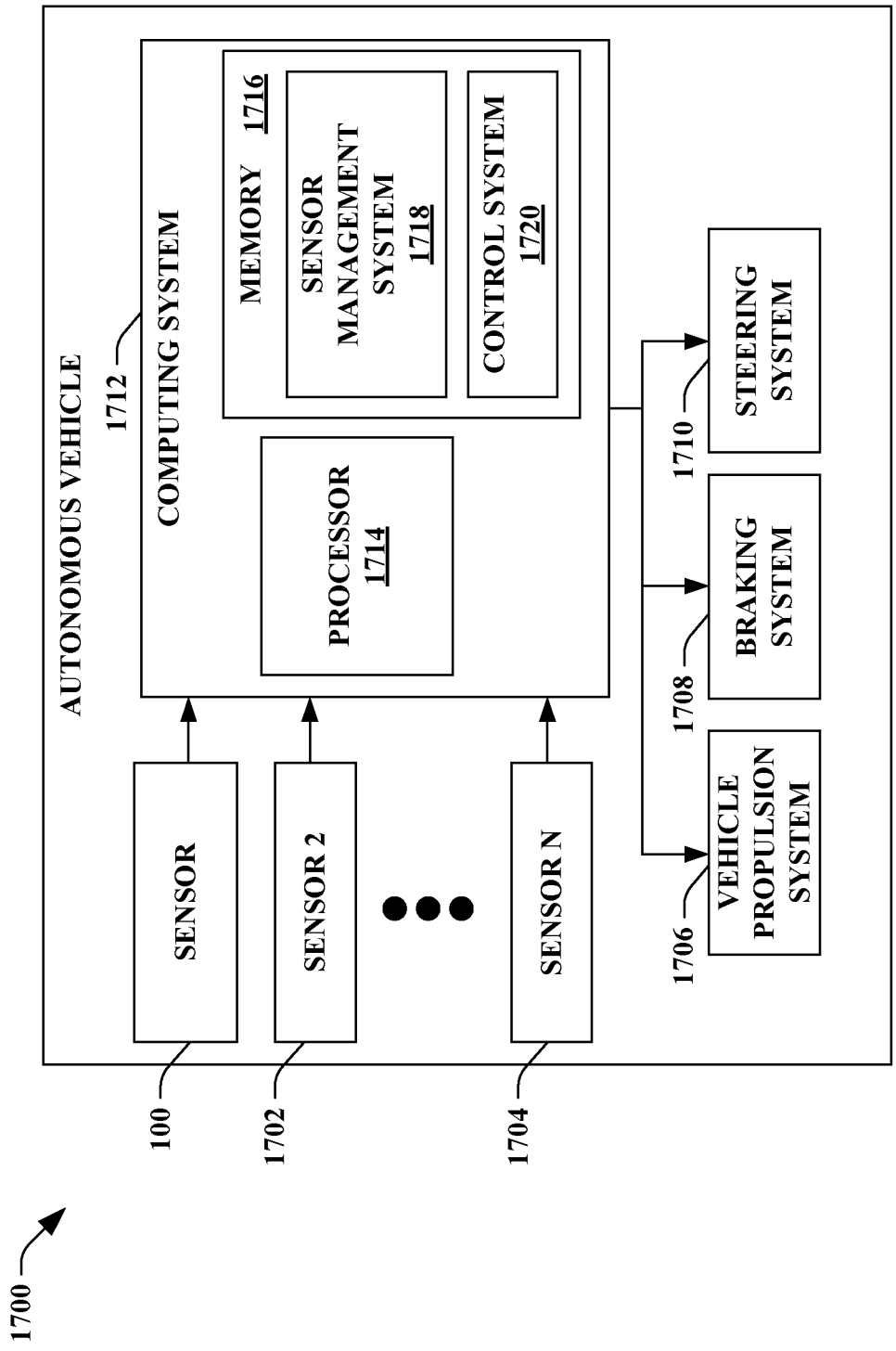
FIG. 17 illustrates an exemplary autonomous vehicle that includes the sensor of FIG. 1.

Referring now to the drawings, FIG. 17 illustrates an autonomous vehicle 1700. The autonomous vehicle 1700 can navigate about roadways without human conduction based upon sensor signals outputted by sensors of the autonomous vehicle 1700. The autonomous vehicle 1700 includes a plurality of sensors; for instance, the autonomous vehicle 1700 can include the sensor 100 as well as substantially any number of additional sensors (a sensor 2 1702, . . . , and a sensor N 1704, where N can be substantially any integer greater than 2). The sensors 100 and 1702-1704 can include one or more types of sensors and are arranged about the autonomous vehicle 1700. The types of sensors include lidar sensors, radar sensors, camera sensors, sonar sensors, infrared sensors, hybrid sensors, and so forth.

The autonomous vehicle 1700 further includes several mechanical systems that are used to effectuate appropriate motion of the autonomous vehicle 1700. For instance, the mechanical systems can include, but are not limited to, a vehicle propulsion system 1706, a braking system 1708, and a steering system 1710. The vehicle propulsion system 1706 may be an electric engine or a combustion engine. The braking system 1708 can include an engine brake, brake pads, actuators, and/or any other suitable componentry that is configured to assist in decelerating the autonomous vehicle 1700. The steering system 1710 includes suitable componentry that is configured to control the direction of movement of the autonomous vehicle 1700.

The autonomous vehicle 1700 additionally includes a computing system 1712 that is in communication with the sensors 100 and 1702-1704, the vehicle propulsion system 1706, the braking system 1708, and the steering system 1710. The computing system 1712 includes a processor 1714 and memory 1716; the memory 1716 includes computer-executable instructions that are executed by the processor 1714. Pursuant to various examples, the processor 1714 can be or include a graphics processing unit (GPU), a plurality of GPUs, a central processing unit (CPU), a plurality of CPUs, an application-specific integrated circuit (ASIC), a microcontroller, a programmable logic controller (PLC), a field programmable gate array (FPGA), or the like.

The memory 1716 can include a sensor management system 1718 configured to control operation of one or more of the sensors 100 and 1702-1704. According to an illustration, the sensor management system 1718 can enable operation of a sensor. Pursuant to another example, the sensor management system 1718 can detect a condition of the sensor and control the sensor based on the detected condition (e.g., detect a blockage in a liquid cooling solution and enable an air cooling solution in response).

The memory 1716 also includes a control system 1720. The control system 1720 is configured to control at least one of the mechanical systems of the autonomous vehicle 1700 (e.g., at least one of the vehicle propulsion system 1706, the braking system 1708, and/or the steering system 1710).

Figure 18:
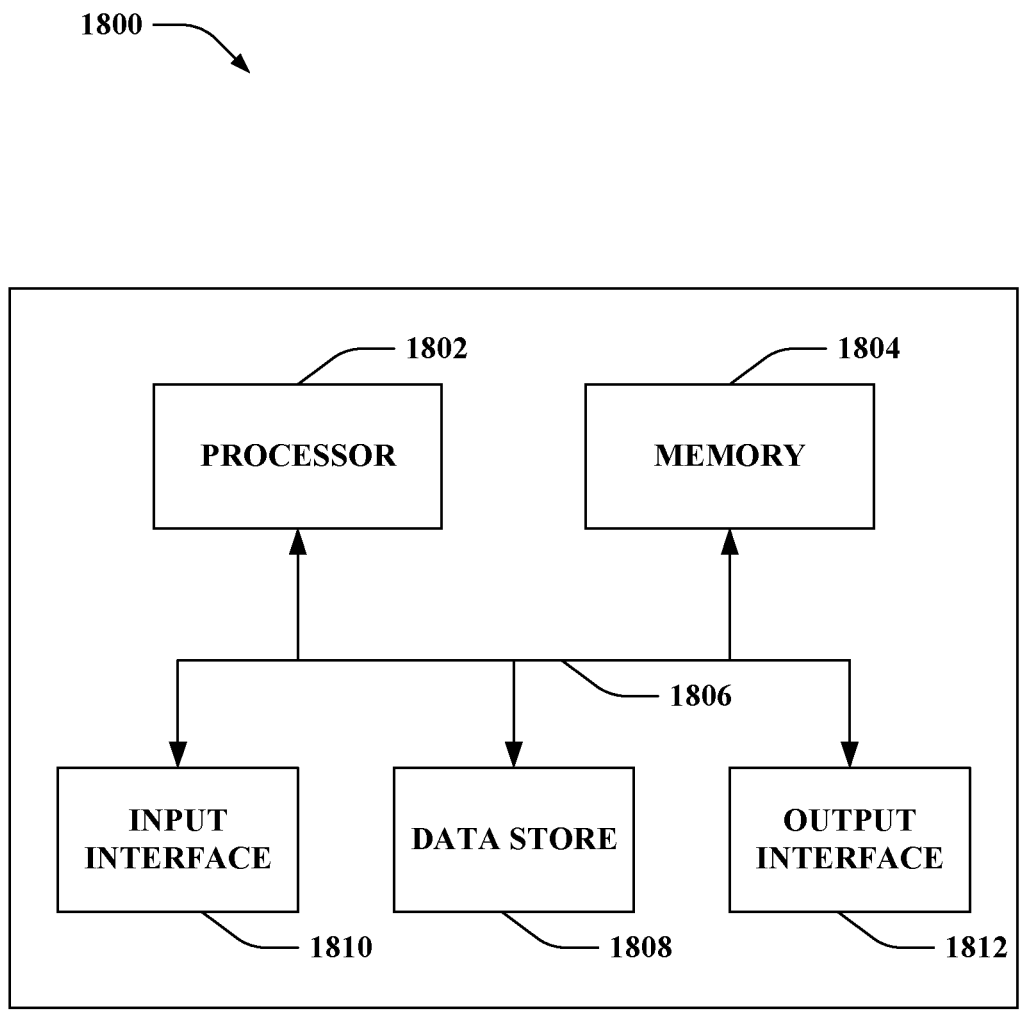
FIG. 18 illustrates an exemplary computing device.

Referring now to FIG. 18, a high-level illustration of an exemplary computing device 1800 that can be used in accordance with the systems and methodologies disclosed herein is illustrated. For instance, the computing device 1800 may be or include the computing system 1712. The computing device 1800 includes at least one processor 1802 that executes instructions that are stored in a memory 1804. The instructions may be, for instance, instructions for implementing functionality described as being carried out by one or more systems discussed above or instructions for implementing one or more of the methods described above. The processor 1802 may be a GPU, a plurality of GPUs, a CPU, a plurality of CPUs, a multi-core processor, etc. The processor 1802 may access the memory 1804 by way of a system bus 1806. In addition to storing executable instructions, the memory 1804 may also store data obtained by one or more sensors, and so forth.

The computing device 1800 additionally includes a data store 1808 that is accessible by the processor 1802 by way of the system bus 1806. The data store 1808 may include executable instructions, data obtained by one or more sensors, etc. The computing device 1800 also includes an input interface 1810 that allows external devices to communicate with the computing device 1800. For instance, the input interface 1810 may be used to receive instructions from an external computer device, etc. According to an example, the input interface 1810 can receive data from one or more of the sensors 100 and 1702-1704. The computing device 1800 also includes an output interface 1812 that interfaces the computing device 1800 with one or more external devices. For example, the computing device 1800 may transmit control signals to the vehicle propulsion system 1706, the braking system 1708, and/or the steering system 1710 by way of the output interface 1812.

Additionally, while illustrated as a single system, it is to be understood that the computing device 1800 may be a distributed system. Thus, for instance, several devices may be in communication by way of a network connection and may collectively perform tasks described as being performed by the computing device 1800.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A sensor, comprising:
   a top cover, the top cover comprises a first vapor chamber;
   a bottom cover, the bottom cover comprises a second vapor chamber, wherein the top cover and the bottom cover form at least a portion of a casing of the sensor;
   a coldplate having a top side and a bottom side;
   a first printed circuit board having a top side and a bottom side, wherein the top side of the first printed circuit board is coupled to the top cover and the bottom side of the first printed circuit board is coupled to the top side of the coldplate;
   a second printed circuit board having a top side and a bottom side, wherein the top side of the second printed circuit board is coupled to the bottom side of the coldplate and the bottom side of the second printed circuit board is coupled to the bottom cover;
   a flexible vapor line having a first end and a second end, the flexible vapor line being a flexible tube that lacks an internal structure;
   a flexible liquid line having a first end and a second end, the flexible liquid line being a flexible tube that comprises an internal structure; and
   a remote heat sink;
   wherein the first end of the flexible vapor line is coupled to the coldplate and the second end of the flexible vapor line is coupled to the remote heat sink; and
   wherein the first end of the flexible liquid line is coupled to the remote heat sink and the second end of the flexible liquid line is coupled to the coldplate.

2. The sensor of claim 1, wherein
   the top cover is a single structural unit that defines the first vapor chamber, the first vapor chamber comprises a first wick structure, and the first vapor chamber is filled with an amount of a working fluid; and
   the bottom cover is a single structural unit that defines the second vapor chamber, the second vapor chamber comprises a second wick structure, and the second vapor chamber is filled with an amount of the working fluid.

3. The sensor of claim 1, further comprising:
   a heat spreader, the heat spreader being between a component on the bottom side of the first printed circuit board and the top side of the coldplate, the heat spreader being formed of pyrolytic graphite.

4. The sensor of claim 1, wherein a first component and a second component are on the bottom side of the first printed circuit board, and wherein the coldplate is referenced to a top of the first component.

5. The sensor of claim 4, wherein a first thermal interface material layer is between the first component and the coldplate, a second thermal interface material layer is between the second component and the coldplate, and a third thermal interface material layer is between the first printed circuit board and the coldplate.

6. The sensor of claim 4, wherein proximate mounting holes are defined through the first printed circuit board, the proximate mounting holes are located around the first component, and the proximate mounting holes are attachment locations at which the first printed circuit board and the coldplate are attached.

7. The sensor of claim 1, further comprising:
   a solar panel on a top of the top cover, the solar panel configured to generate electricity from solar radiation incident upon the solar panel;
   wherein the sensor is at least partially powered by the electricity generated by the solar panel.

8. The sensor of claim 1, further comprising:
a cooling component configured to cool the sensor by air cooling, the cooling component being initiated upon detection of a failure of liquid cooling in the coldplate.

9. The sensor of claim 1, the top cover further comprises at least one window, wherein an antimony doped tin coating is on the at least one window.

10. The sensor of claim 1, the sensor being included in an autonomous vehicle.

11. The sensor of claim 1, the sensor being one of a radar sensor, a lidar sensor, a camera sensor, or a hybrid sensor.

12. A sensor, comprising:
a top cover;
a bottom cover, wherein the top cover and the bottom cover form at least a portion of a casing of the sensor;
a coldplate having a top side and a bottom side;
a first printed circuit board having a top side and a bottom side, wherein the top side of the first printed circuit board is coupled to the top cover and the bottom side of the first printed circuit board is coupled to the top side of the coldplate;
a second printed circuit board having a top side and a bottom side, wherein the top side of the second printed circuit board is coupled to the bottom side of the coldplate and the bottom side of the second printed circuit board is coupled to the bottom cover;
a flexible vapor line having a first end and a second end, the flexible vapor line being a flexible tube that lacks an internal structure;
a flexible liquid line having a first end and a second end, the flexible liquid line being a flexible tube that comprises an internal structure; and
a remote heat sink;
wherein the first end of the flexible vapor line is coupled to the coldplate and the second end of the flexible vapor line is coupled to the remote heat sink; and
wherein the first end of the flexible liquid line is coupled to the remote heat sink and the second end of the flexible liquid line is coupled to the coldplate.

13. The sensor of claim 12, wherein a first thermal interface material layer is between the first component and the coldplate, a second thermal interface material layer is between the second component and the coldplate, and a third thermal interface material layer is between the first printed circuit board and the coldplate.

14. The sensor of claim 12, wherein proximate mounting holes are defined through the first printed circuit board, the proximate mounting holes are located around the first component, and the proximate mounting holes are attachment locations at which the first printed circuit board and the coldplate are attached.

15. The sensor of claim 12, further comprising:
a heat spreader, the heat spreader being between the first component on the bottom side of the first printed circuit board and the top side of the coldplate, the heat spreader being formed of pyrolytic graphite.

16. The sensor of claim 12, wherein the top cover comprises a first vapor chamber, the first vapor chamber comprises a first wick structure, the bottom cover comprises a second vapor chamber, and the second vapor chamber comprises a second wick structure.

17. An autonomous vehicle, comprising:
a sensor, comprising:
a top cover;
a bottom cover, wherein the top cover and the bottom cover form at least a portion of a casing of the sensor;
a coldplate having a top side and a bottom side;
a first printed circuit board having a top side and a bottom side, wherein the top side of the first printed circuit board is coupled to the top cover and the bottom side of the first printed circuit board is coupled to the top side of the coldplate;
a second printed circuit board having a top side and a bottom side, wherein the top side of the second printed circuit board is coupled to the bottom side of the coldplate and the bottom side of the second printed circuit board is coupled to the bottom cover;
a flexible vapor line having a first end and a second end, the flexible vapor line being a flexible tube that lacks an internal structure;
a flexible liquid line having a first end and a second end, the flexible liquid line being a flexible tube that comprises an internal structure; and
a remote heat sink;
wherein the first end of the flexible vapor line is coupled to the coldplate and the second end of the flexible vapor line is coupled to the remote heat sink; and
wherein the first end of the flexible liquid line is coupled to the remote heat sink and the second end of the flexible liquid line is coupled to the coldplate.

18. The sensor of claim 12, wherein the first printed circuit board comprises a first component and a second component on the bottom side of the first printed circuit board, and the coldplate is referenced to a top of the first component.

19. The sensor of claim 12, wherein the coldplate comprises a hallow chamber under vacuum.

20. The sensor of claim 12, wherein the flexible liquid line transfers liquid from the first end coupled to the remote heat sink to the second end coupled to the coldplate.

* * * * *